United States Patent
Ishibashi et al.

(10) Patent No.: US 11,083,079 B2
(45) Date of Patent: Aug. 3, 2021

(54) TERMINAL DEVICE

(71) Applicant: MITSUBISHI ELECTRIC CORPORATION, Tokyo (JP)

(72) Inventors: Hidenori Ishibashi, Tokyo (JP); Yukinobu Tarui, Tokyo (JP); Yuko Onodera, Tokyo (JP); Hiroyuki Aoyama, Tokyo (JP); Naofumi Yoneda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 33 days.

(21) Appl. No.: 16/346,611

(22) PCT Filed: Dec. 26, 2016

(86) PCT No.: PCT/JP2016/088705
§ 371 (c)(1),
(2) Date: May 1, 2019

(87) PCT Pub. No.: WO2018/122920
PCT Pub. Date: Jul. 5, 2018

(65) Prior Publication Data
US 2019/0306969 A1    Oct. 3, 2019

(51) Int. Cl.
*H05K 1/02*    (2006.01)
*H01P 3/08*    (2006.01)
(Continued)

(52) U.S. Cl.
CPC ........... *H05K 1/0253* (2013.01); *H01P 1/268* (2013.01); *H01P 3/081* (2013.01); *H01P 5/02* (2013.01);
(Continued)

(58) Field of Classification Search
CPC .... H05K 1/0253; H05K 1/024; H05K 1/0248; H05K 7/20418; H05K 7/20436;
(Continued)

(56) References Cited

U.S. PATENT DOCUMENTS 4,647,877 A    3/1987 Thompson
5,150,084 A *  9/1992 Asa ................. H01P 1/2135
                                              333/128

(Continued)

FOREIGN PATENT DOCUMENTS

EP    0 040 567 A1    11/1981
JP    54-083835 U1    6/1979
(Continued)

OTHER PUBLICATIONS

International Search Report for PCT/JP2016/086705 (PCT/ISA/210) dated Mar. 21, 2007, with English translation.
Japanese Office Action for Japanese Patent Application No. 2017-531642 dated Jul. 11, 2017, with English translation.

*Primary Examiner* — Robert J Pascal
*Assistant Examiner* — Kimberly E Glenn
(74) *Attorney, Agent, or Firm* — Birch, Stewart, Kolasch & Birch, LLP

(57) ABSTRACT

Lossy members, which are disposed to overlap with a part of branch conductors in a signal conductor, respectively, and cause a loss of the power of signals flowing in the branch conductors, and via holes connecting each of the output terminals of the signal conductor and the ground conductor are included. The branch conductor includes a delay circuit having an electrical length of 90 degrees.

10 Claims, 13 Drawing Sheets

(51) Int. Cl.
  *H01P 5/02*    (2006.01)
  *H01P 7/08*    (2006.01)
  *H05K 7/20*    (2006.01)
  *H01P 5/12*    (2006.01)
  *H01P 1/26*    (2006.01)

(52) U.S. Cl.
  CPC ............... *H01P 5/12* (2013.01); *H01P 7/082* (2013.01); *H05K 1/024* (2013.01); *H05K 1/0248* (2013.01); *H05K 7/20418* (2013.01); *H05K 7/20436* (2013.01); *H05K 2201/066* (2013.01); *H05K 2201/093* (2013.01)

(58) Field of Classification Search
  CPC ........ H05K 2201/066; H05K 2201/093; H01P 5/12; H01P 1/268; H01P 3/081; H01P 5/02; H01P 7/082; H01P 1/26; H01P 3/08
  USPC ............................................................ 333/4
  See application file for complete search history.

(56) References Cited

U.S. PATENT DOCUMENTS

| | | | | |
|---|---|---|---|---|
| 5,929,746 A | * | 7/1999 | Edwards, Jr. | ............ H01C 1/14 |
| | | | | 338/203 |
| 6,194,979 B1 | | 2/2001 | Bloom et al. | |
| 9,078,371 B2 | * | 7/2015 | Brown | ................ H05K 1/0234 |

FOREIGN PATENT DOCUMENTS

| | | |
|---|---|---|
| JP | 02-193401 A1 | 7/1990 |
| JP | 06-152206 A | 5/1994 |
| JP | 06-318804 A | 11/1994 |
| JP | 2000-357960 A1 | 12/2000 |
| JP | 2003-101309 A | 4/2003 |
| JP | 2009-147600 A | 7/2009 |
| WO | WO-2017122269 A1 * | 7/2017 ............... H01P 1/26 |

* cited by examiner

TERMINAL DEVICE

TECHNICAL FIELD

The present invention relates to a terminal device for suppressing unnecessary reflection of a signal.

BACKGROUND ART

A terminal device is an electronic device attached to an input/output terminal of a high frequency circuit such as a communication device.

When a signal output from a high frequency circuit is input to a signal conductor inside a terminal device, the power of the signal flowing in the signal conductor is lost in a lossy member, whereby unnecessary reflection of the signal to the high frequency circuit is suppressed.

The following Patent Literature 1 discloses an open-ended terminal device in which a plurality of power non-reflectors is connected to a distributor as lossy members.

In this terminal device, for the purpose of enhancing the power withstanding performance without increasing the size of the lossy member, a signal is distributed by the distributor, and then the plurality of power non-reflectors causes a loss of the power of each of the signals.

CITATION LIST

Patent Literatures

Patent Literature 1: JP H2-193401 A (JP 1990-193401 A)

SUMMARY OF INVENTION

Technical Problem

Since the conventional terminal device is configured as described above, the plurality of power non-reflectors, as being lossy members, can cause a loss of the power of the signal. However, open-ended terminal devices have a problem that it is difficult to allow the heat generated in lossy members to dissipate, thus resulting in trapped heat.

Further, when the distribution number by a distributor is increased for the purpose of enhancing the power withstanding performance, the size of the circuit increases. When the size of a lossy member is increased for the purpose of enhancing the power withstanding performance without increasing the distribution number by a distributor, since the influence of frequency characteristics of the lossy member increases, there is a problem that it is difficult to broaden the available frequency band.

The present invention has been devised in order to solve the problems described above, and it is an object of the present invention to provide a terminal device capable of suppressing trapping of heat, enhancing the power withstanding performance, and broadening the available frequency band.

Solution to Problem

A terminal device according to the present invention includes: a dielectric substrate formed of a dielectric; a signal conductor disposed in a first layer of the dielectric substrate, the signal conductor having a branching point at which the signal conductor branches into two, the branching point being midway from an input terminal to an output terminal; a ground conductor disposed in a second layer of the dielectric substrate opposing the first layer of the dielectric substrate; lossy members disposed to overlap with: a part of a first branch conductor extending from the branching point of the signal conductor to a first output terminal; and a part of a second branch conductor extending from the branching point of the signal conductor to a second output terminal, in a thickness direction of the dielectric substrate, the lossy members causing a loss of power of signals flowing in the first branch conductor and the second branch conductor; and a connecting members connecting each of the first output terminal and the second output terminal and the ground conductor, the connecting members each formed as a via hole connecting the first layer and the second layer of the dielectric substrate. The first branch conductor includes a delay circuit having an electrical length longer than an electrical length of the second branch conductor by 90 degrees. The ground conductor is disposed on an entire surface of the second layer of the dielectric substrate.

Advantageous Effects of Invention

According to the present invention, the following components are included: a dielectric substrate formed of a dielectric; a signal conductor disposed in a first layer of the dielectric substrate, the signal conductor having a branching point at which the signal conductor branches into two, the branching point being midway from an input terminal to an output terminal; a ground conductor disposed in a second layer of the dielectric substrate opposing the first layer of the dielectric substrate; lossy members disposed to overlap with: a part of a first branch conductor extending from the branching point of the signal conductor to a first output terminal; and a part of a second branch conductor extending from the branching point of the signal conductor to a second output terminal, in a thickness direction of the dielectric substrate, the lossy members causing a loss of power of signals flowing in the first branch conductor and the second branch conductor; and a connecting members connecting each of the first output terminal and the second output terminal and the ground conductor, the connecting members each formed as a via hole connecting the first layer and the second layer of the dielectric substrate. The first branch conductor includes a delay circuit having an electrical length longer than an electrical length of the second branch conductor by 90 degrees. The ground conductor is disposed on an entire surface of the second layer of the dielectric substrate. Therefore, trapping of the heat can be suppressed while the power withstanding performance can be enhanced, and the available frequency band can be broadened.

DESCRIPTION OF EMBODIMENTS

To describe the invention further in detail, some embodiments for carrying out the invention will be described below with reference to the accompanying drawings.

First Embodiment

Figure 1:
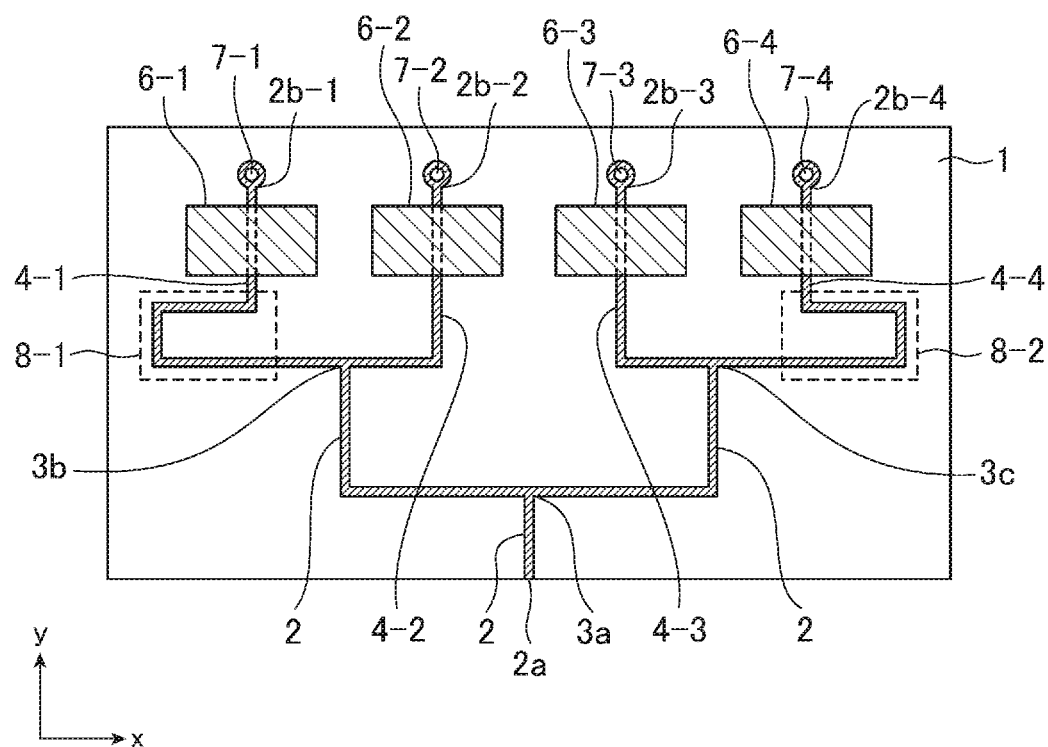
FIG. 1 is a top view illustrating a terminal device according to a first embodiment of the present invention.
Figure 2:
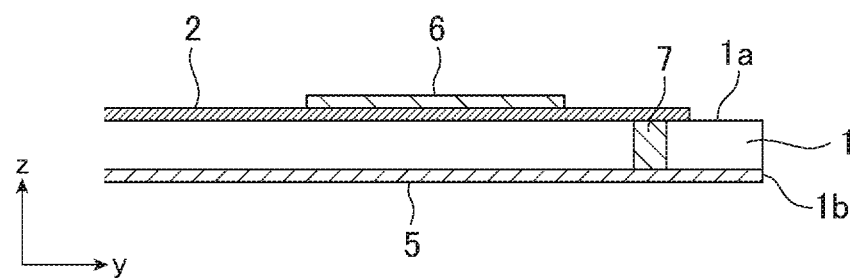
FIG. 2 is a cross-sectional view illustrating the terminal device according to the first embodiment of the present invention.

FIG. 1 is a top view illustrating a terminal device according to a first embodiment of the invention, and FIG. 2 is a cross-sectional view illustrating the terminal device according to the first embodiment of the invention.

In FIGS. 1 and 2, a dielectric substrate 1 is formed of a dielectric.

A signal conductor 2 is disposed on a front surface 1a (first layer) of the dielectric substrate 1 and has a point branching into two on ways from an input terminal 2a to output terminals 2b-1, 2b-2, 2b-3, and 2b-4.

The output terminals 2b-1 and 2b-4 are first output terminals, and the output terminals 2b-2 and 2b-3 are second output terminals.

It is only required for the signal conductor 2 to branch at least into two. In the example shown in FIG. 1, the signal conductor 2 branches into four. Therefore, in the example of FIG. 1, the signal conductor 2 has branch parts 3a, 3b, and 3c as three branching points.

A branch conductor 4-1 is a first branch conductor in the signal conductor 2 extending from the branch part 3b of the signal conductor 2 to the output terminal 2b-1.

A branch conductor 4-2 is a second branch conductor in the signal conductor 2 extending from the branch part 3b of the signal conductor 2 to the output terminal 2b-2.

A branch conductor 4-3 is a second branch conductor in the signal conductor 2 extending from the branch part 3c of the signal conductor 2 to the output terminal 2b-3.

A branch conductor 4-4 is a first branch conductor in the signal conductor 2 extending from the branch part 3c of the signal conductor 2 to the output terminal 2b-4.

A ground conductor 5 is arranged on the entire back surface 1b (second layer) of the dielectric substrate 1.

Each of lossy members 6-1, 6-2, 6-3, and 6-4 includes, for example, a resistor.

The lossy member 6-1 is disposed to overlap with a part of the branch conductor 4-1 to cause a loss of the power of a signal flowing in the branch conductor 4-1.

The lossy member 6-2 is disposed to overlap with a part of the branch conductor 4-2 to cause a loss of the power of a signal flowing in the branch conductor 4-2.

The lossy member 6-3 is disposed to overlap with a part of the branch conductor 4-3 to cause a loss of the power of a signal flowing in the branch conductor 4-3.

The lossy member 6-4 is disposed to overlap with a part of the branch conductor 4-4 to cause a loss of the power of a signal flowing in the branch conductor 4-4.

A via hole 7-1 is a connecting member connecting the output terminal 2b-1 of the signal conductor 2 and the ground conductor 5.

A via hole 7-2 is a connecting member connecting the output terminal 2b-2 of the signal conductor 2 and the ground conductor 5.

A via hole 7-3 is a connecting member connecting the output terminal 2b-3 of the signal conductor 2 and the ground conductor 5.

A via hole 7-4 is a connecting member connecting the output terminal 2b-4 of the signal conductor 2 and the ground conductor 5.

A delay circuit 8-1 has an electrical length of 90 degrees, and is included in the branch conductor 4-1.

A delay circuit 8-2 has an electrical length of 90 degrees, and is included in the branch conductor 4-4.

The electrical length of 90 degrees of the delay circuits 8-1 and 8-2 is a quarter of the wavelength of a signal input from the input terminal 2a of the signal conductor 2.

Next, the operation will be described.

A signal input from the input terminal 2a of the signal conductor 2 propagates in the signal conductor 2.

The power of the signal propagated in the signal conductor 2 is distributed in two at the branch part 3a.

One of the two pieces of the power of the signal distributed at the branch part 3a is distributed in two at the branch part 3b, and the other one of the two pieces of the power of the signal distributed at the branch part 3a is distributed in two at the branch part 3c.

As a result, the power of the signal input from the input terminal 2a of the signal conductor 2 is distributed into four, and the signals the power of which is branched into four separately propagate in the branch conductors 4-1, 4-2, 4-3, and 4-4.

The signals propagated in the branch conductors 4-1, 4-2, 4-3, and 4-4 reach the output terminals 2b-1, 2b-2, 2b-3, and 2b-4 of the signal conductor 2. A part of the power of the signals propagated in the branch conductors 4-1, 4-2, 4-3, and 4-4 is lost by the lossy members 6-1, 6-2, 6-3 and 6-4.

That is, the power of the signals propagated in the branch conductors 4-1, 4-2, 4-3, and 4-4 is applied to the lossy members 6-1, 6-2, 6-3, and 6-4, respectively, and the power of the signals applied to the lossy members 6-1, 6-2, 6-3, and 6-4 is mainly converted into heat and lost.

At this time, the heat generated from the lossy members 6-1, 6-2, 6-3, and 6-4 passes through the branch conductors 4-1, 4-2, 4-3, and 4-4, the output terminals 2b-1, 2b-2, 2b-3, and 2b-4, and the via holes 7-1, 7-2, 7-3, and 7-4 to reach the ground conductor 5.

Since the ground conductor 5 is disposed on the entire back surface 1b of the dielectric substrate 1, the ground conductor 5 has a large area. Further, the ground conductor 5 has high thermal conductivity. Therefore, the ground conductor 5 is a member having high heat radiation properties.

Therefore, the heat generated from the lossy members 6-1, 6-2, 6-3, and 6-4 is efficiently radiated from the ground conductor 5.

In the terminal device of the first embodiment, the output terminals 2b-1, 2b-2, 2b-3, and 2b-4 of the signal conductor 2 are connected with the ground conductor 5 via the via holes 7-1, 7-2, 7-3, and 7-4, which is one of the features of this embodiment, and thus the heat can be efficiently radiated from the ground conductor 5.

Figure 3:
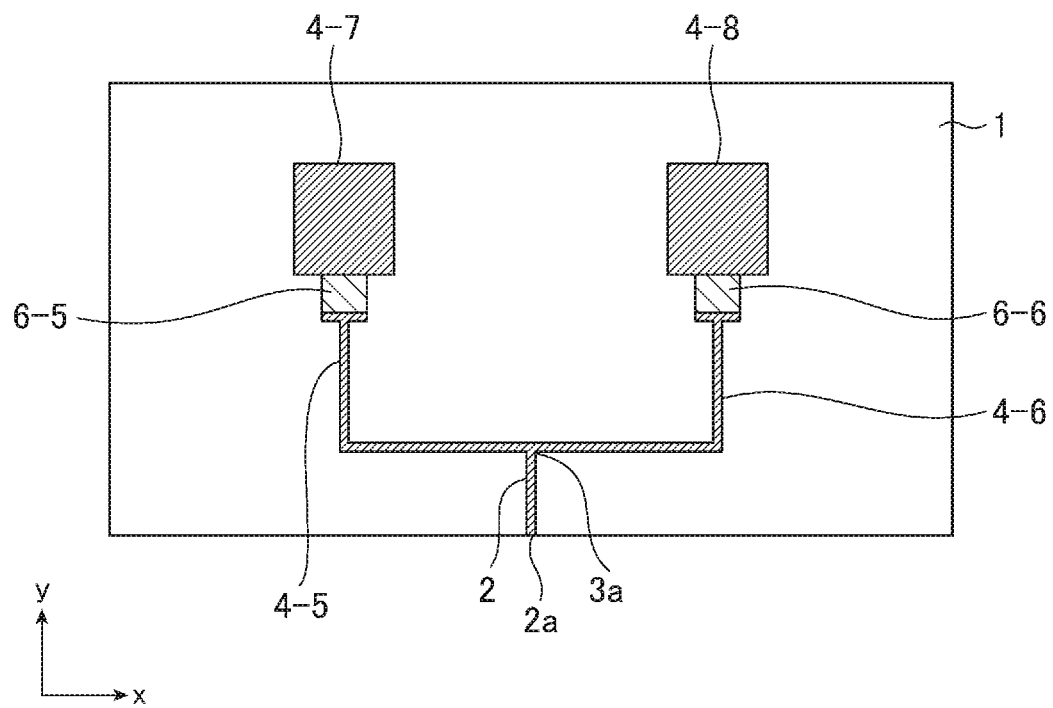
FIG. 3 is a top view illustrating a conventional terminal device.

A terminal device not having such a feature (hereinafter referred to as a conventional terminal device) has a configuration as illustrated in FIG. 3.

FIG. 3 is a top view illustrating a conventional terminal device. In FIG. 3, the same symbols as those in FIG. 1 denote the same or corresponding parts.

In the conventional terminal device, lossy members 6-5 and 6-6 are connected to branch conductors 4-5 and 4-6 of a signal conductor 2 as illustrated in FIG. 3.

The lossy members 6-5 and 6-6 are connected with branch conductors 4-7 and 4-8 having a wider line width than the line width of the branch conductors 4-5 and 4-6 so as to have a low impedance.

In the case where the terminal device is configured as in FIG. 3, heat concentrates at the input parts of the lossy members 6-5 and 6-6.

In the terminal device of FIG. 3, a dielectric substrate 1 and the signal conductor 2 serve as heat radiation paths for the heat generated at the input parts of the lossy members 6-5 and 6-6; however, the dielectric substrate 1 has a low thermal conductivity as compared to that of the ground conductor 5 in the terminal device of the first embodiment and thus has a lower heat radiation property as compared to that of the ground conductor 5.

In addition, the signal conductor 2 has high thermal conductivity but has a narrower area as compared to that of the ground conductor 5, and thus the heat radiation property is lower than that of the ground conductor 5.

Therefore, in the conventional terminal device, it is difficult to release the heat generated at the input parts of the lossy members 6-5 and 6-6 as compared with the terminal device of the first embodiment, and there are cases where the heat is trapped.

There are cases where not all the power of a signal is converted into heat by the lossy members 6-1, 6-2, 6-3, and 6-4 and a part of the power of the signal is not converted into heat.

Signals the power of which is not converted into heat by the lossy members 6-1, 6-2, 6-3, and 6-4 pass through the branch conductors 4-1, 4-2, 4-3, and 4-4 to reach the ground conductor 5 via the via holes 7-1, 7-2, 7-3, and 7-4.

The signals reached the ground conductor 5 are reflected by the ground conductor 5.

The signals reflected by the ground conductor 5 reach the branch conductors 4-1, 4-2, 4-3, and 4-4 through the via holes 7-1, 7-2, 7-3, and 7-4 and propagate in the branch conductors 4-1, 4-2, 4-3, and 4-4.

Here, the branch conductor 4-1 includes the delay circuit 8-1 having an electrical length of 90 degrees.

Therefore, a signal that reaches the output terminal 2b-1 from the branch part 3b of the signal conductor 2 via the branch conductor 4-1 has a phase delayed by 90 degrees by the delay circuit 8-1 included in the branch conductor 4-1.

Further, being reflected by the ground conductor 5, the signal passing from the output terminal 2b-1 through the branch conductor 4-1 to reach the branch part 3b has a phase delayed by 90 degrees by the delay circuit 8-1 included in the branch conductor 4-1.

As a result, being reflected by the ground conductor 5, the phase of the reflection signal that has reached the branch part 3b from the output terminal 2b-1 via the branch conductor 4-1 is delayed by 180 degrees as compared to the phase of a reflection signal reaching the branch part 3b from the output terminal 2b-2 via the branch conductor 4-2.

That is, the reflection signal reaching the branch part 3b via the branch conductor 4-1 and the reflection signal reaching the branch part 3b via the branch conductor 4-2 have inverse phases.

Therefore, the reflection signal reaching the branch part 3b via the branch conductor 4-1 and the reflection signal reaching the branch part 3b via the branch conductor 4-2 are synthesized with inverse phases to cancel out each other. Therefore, these reflection signals hardly reach the branch part 3a of the signal conductor 2, thus deterioration of reflection characteristics accompanied by an increase of reflection signals can be suppressed. As a result, even in the case where the size of the lossy members 6-1, 6-2, 6-3, and 6-4 is increased in order to improve the power withstanding performance, the influence of frequency characteristics of the lossy members 6-1, 6-2, 6-3, and 6-4 is small, and thus the available frequency band can be broadened.

Further, the branch conductor 4-4 includes the delay circuit 8-2 having an electrical length of 90 degrees.

Therefore, a signal that reaches the output terminal 2b-4 from the branch part 3c of the signal conductor 2 via the branch conductor 4-4 has a phase delayed by 90 degrees by the delay circuit 8-2 included in the branch conductor 4-4.

Further, being reflected by the ground conductor 5, the signal passing from the output terminal 2b-4 through the branch conductor 4-4 to reach the branch part 3c has a phase delayed by 90 degrees by the delay circuit 8-2 included in the branch conductor 4-4.

As a result, being reflected by the ground conductor 5, the phase of the reflection signal that has reached the branch part 3c from the output terminal 2b-4 via the branch conductor 4-4 is delayed by 180 degrees as compared to the phase of a reflection signal reaching the branch part 3c from the output terminal 2b-3 via the branch conductor 4-3.

That is, the reflection signal reaching the branch part 3c via the branch conductor 4-4 and the reflection signal reaching the branch part 3c via the branch conductor 4-3 have inverse phases.

Therefore, the reflection signal reaching the branch part 3c via the branch conductor 4-4 and the reflection signal reaching the branch part 3c via the branch conductor 4-3 are synthesized with inverse phases to cancel out each other. Therefore, these reflection signals hardly reach the branch part 3a of the signal conductor 2, thus deterioration of reflection characteristics accompanied by an increase of reflection signals can be suppressed. As a result, the available frequency band can be broadened.

As is apparent from the above description, according to the first embodiment, lossy members 6-1, 6-2, which are disposed to overlap with a part of branch conductors 4-1, 4-2 in a signal conductor 2, respectively, and cause a loss of the power of signals flowing in the branch conductors 4-1, 4-2, and via holes 7-1, 7-2 connecting each of the output terminals 2b-1, 2b-2 of the signal conductor 2 and the ground conductor 5 are included. The branch conductor 4-1 includes a delay circuit 8-1 having an electrical length of 90 degrees. Therefore, trapping of the heat can be suppressed while the power withstanding performance can be enhanced, and the available frequency band can be broadened.

Furthermore, according to the first embodiment, the lossy members 6-3 and 6-4, which are disposed to overlap with a part of the branch conductors 4-3 and 4-4 in the signal conductor 2, respectively, and cause a loss of the power of signals flowing in the branch conductors 4-3 and 4-4, and the via holes 7-3 and 7-4 connecting the output terminals 2b-3 and 2b-4 of the signal conductor 2, respectively, and the ground conductor 5 are included. The branch conductor 4-4 includes the delay circuit 8-2 having an electrical length of 90 degrees. Therefore, trapping of the heat can be suppressed while the power withstanding performance can be enhanced, and thus the available frequency band can be broadened.

In the first embodiment, the example in which the lossy members 6-1, 6-2, 6-3, and 6-4 are disposed to cover a part of the branch conductors 4-1, 4-2, 4-3, and 4-4, respectively, is illustrated; however, no limitation thereto is intended.

Figure 4:
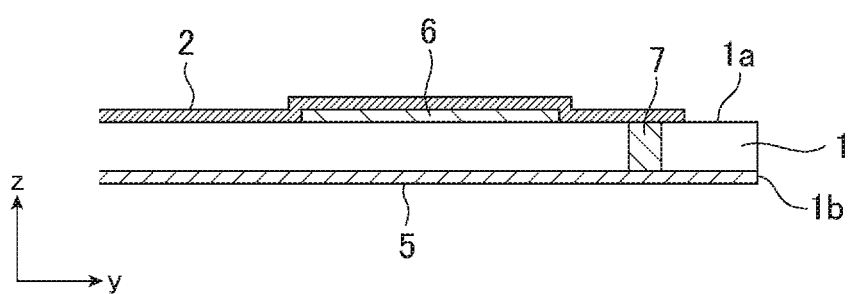
FIG. 4 is a cross-sectional view illustrating another terminal device according to the first embodiment of the present invention.

FIG. 4 is a cross-sectional view illustrating another terminal device according to the first embodiment of the present invention.

In the example of FIG. 4, after the lossy members 6-1, 6-2, 6-3 and 6-4 are formed on the front surface 1a of the dielectric substrate 1, the branch conductors 4-1, 4-2, 4-3, and 4-4 are disposed on the lossy members 6-1, 6-2, 6-3, and 6-4.

In this first embodiment, the example in which the signal conductor 2 branches into four is illustrated; however, it is only required for the signal conductor 2 to branch at least into two.

For example, in a case where the signal conductor 2 branches into two, the signal conductor 2 is only required to include one branch part 3a. In this case, the branch conductors of the signal conductor 2 are the two branch conductors 4-1 and 4-2, and the output terminals of the signal conductor 2 are the two output terminals 2b-1 and 2b-2.

Figure 5:
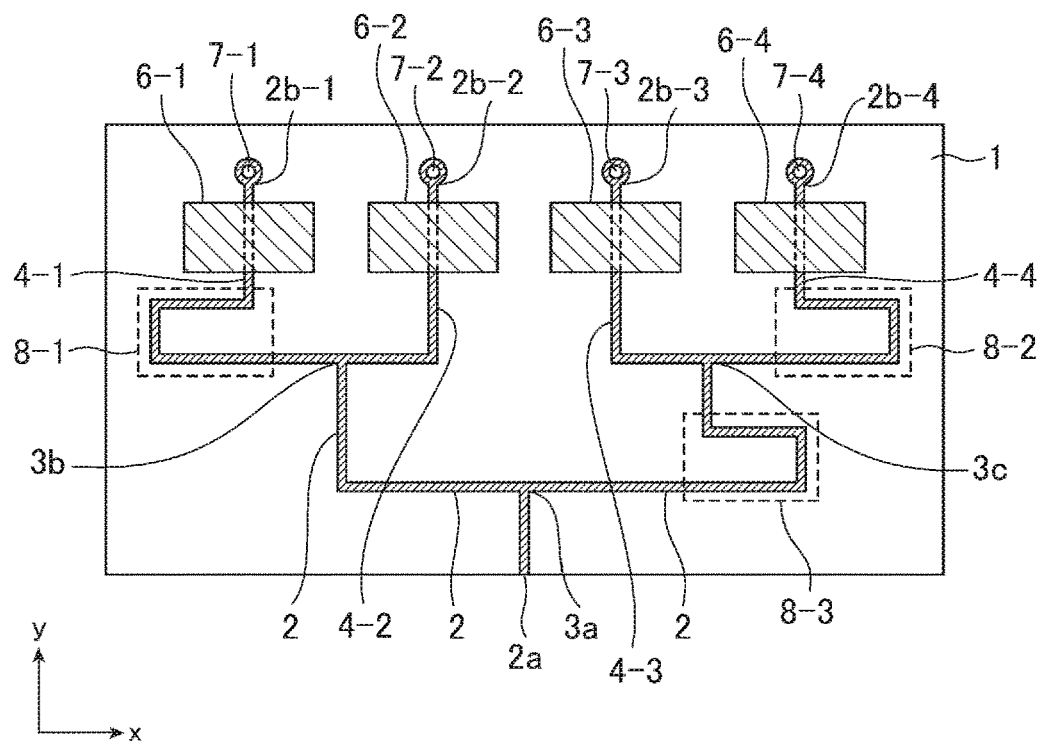
FIG. 5 is a top view illustrating still another terminal device according to the first embodiment of the present invention.

In the example of the first embodiment, the branch conductors 4-1 and 4-4 respectively include the delay circuits 8-1 and 8-2 each having an electrical length of 90 degrees; however, as illustrated in FIG. 5, the signal conductor 2 between the branch part 3a and the branch part 3c may further include a delay circuit 8-3 having an electrical length of 90 degrees.

FIG. 5 is a top view illustrating still another terminal device according to the first embodiment of the present invention.

According to such a configuration, even in the case where reflection signals reach the branch part 3a without being completely canceled out at the branch part 3b or 3c, the delay circuit 8-3 allows a reflection signal reaching the branch part 3a from the branch part 3b and a reflection signal reaching the branch part 3a from the branch part 3c to be synthesized with inverse phases.

Therefore, the reflection signal reaching the branch part 3a from the branch part 3b and the reflection signal reaching the branch part 3a from the branch part 3c cancel out each other, and thus these reflection signals are hardly output to the input terminal 2a. Therefore, deterioration of reflection characteristics accompanied by an increase of reflection signals is further suppressed. Consequently, the available frequency band can be broadened.

Second Embodiment

In the first embodiment, an example in which the output terminals 2b-1, 2b-2, 2b-3, and 2b-4 of the signal conductor 2 are connected to the via holes 7-1, 7-2, 7-3, and 7-4, respectively, is illustrated.

In this second embodiment, the branch conductors 4-1, 4-2, 4-3, and 4-4 each branch into two in a T-letter shape, and two output terminals 2b, which are the branch ends thereof, may be each connected to a via hole 7.

Figure 6:
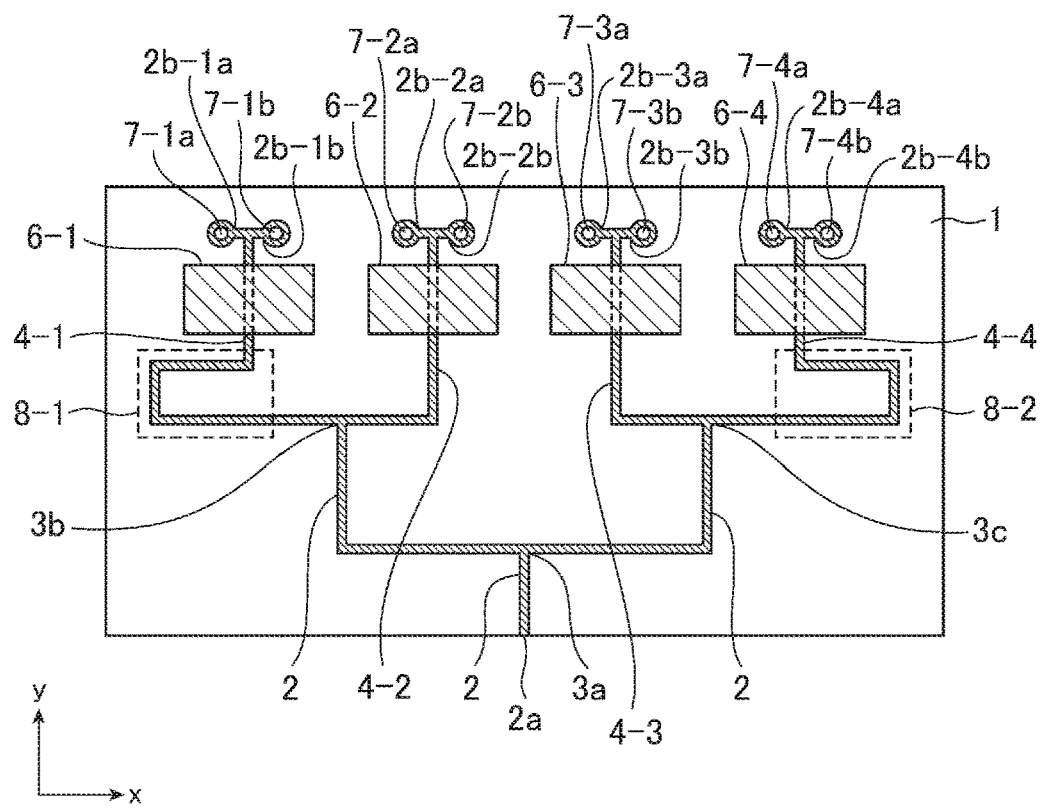
FIG. 6 is a top view illustrating a terminal device according to a second embodiment of the present invention.

FIG. 6 is a top view illustrating a terminal device according to the second embodiment of the present invention. In FIG. 6, the same symbols as those in FIG. 1 represent the same or corresponding parts and thus descriptions thereof are omitted.

A branch conductor 4-1 as a first branch conductor branches into two in a T-letter shape. An output terminal 2b-1a, which is one of the branch ends, is connected to a via hole 7-1a, and an output terminal 2b-1b, which is the other one of the branch ends, is connected to a via hole 7-1b.

Note that a first direction (−x direction) oriented from the branching point of the branch conductor 4-1 toward the output terminal 2b-1a and a second direction (+x direction) oriented from the branching point of the branch conductor 4-1 toward the output terminal 2b-1b are orthogonal to the direction (+y direction) oriented from the input side part of the branching point of the branch conductor 4-1 toward the branching point, and the first direction and the second direction are opposite to each other.

A branch conductor 4-2 as a second branch conductor branches into two in a T-letter shape. An output terminal 2b-2a, which is one of the branch ends, is connected to a via hole 7-2a, and an output terminal 2b-2b, which is the other one of the branch ends, is connected to a via hole 7-2b.

Note that a third direction (−x direction) oriented from the branching point of the branch conductor 4-2 toward the output terminal 2b-2a and a fourth direction (+x direction) oriented from the branching point of the branch conductor 4-2 toward the output terminal 2b-2b are orthogonal to the direction (+y direction) oriented from the input side part of the branching point of the branch conductor 4-2 toward the branching point, and the third direction and the fourth direction are opposite to each other.

A branch conductor 4-3 as a second branch conductor branches into two in a T-letter shape. An output terminal 2b-3a, which is one of the branch ends, is connected to a via hole 7-3a, and an output terminal 2b-3b, which is the other one of the branch ends, is connected to a via hole 7-3b.

Note that the third direction (−x direction) oriented from the branching point of the branch conductor 4-3 toward the output terminal 2b-3a and the fourth direction (+x direction) oriented from the branching point of the branch conductor 4-3 toward the output terminal 2b-3b are orthogonal to the direction (+y direction) oriented from the input side part of the branching point of the branch conductor 4-3 toward the branching point, and the third direction and the fourth direction are opposite to each other.

A branch conductor 4-4 as a first branch conductor branches into two in a T-letter shape. An output terminal 2b-4a, which is one of the branch ends, is connected to a via hole 7-4a, and an output terminal 2b-4b, which is the other one of the branch ends, is connected to a via hole 7-4b.

Note that the first direction (−x direction) oriented from the branching point of the branch conductor 4-4 toward the output terminal 2b-4a and the second direction (+x direction) oriented from the branching point of the branch conductor 4-4 toward the output terminal 2b-4b are orthogonal to the direction (+y direction) oriented from the input side of the branching point of the branch conductor 4-4 toward the branching point, and the first direction and the second direction are opposite to each other.

Next, the operation will be described.

Here, for convenience of explanation, it is assumed that the sizes of lossy members 6-1, 6-2, 6-3, and 6-4 are the same and that the positions of the lossy members 6-1, 6-2, 6-3, and 6-4 in the y direction are the same.

In this assumption, in the first embodiment described above, if the positions of the via holes 7-1, 7-2, 7-3, and 7-4 deviate to each other in the y direction, the distances from the output sides of the lossy members 6-1, 6-2, 6-3, and 6-4 to the ground conductor 5 deviate to each other.

In the case where the distances from the output sides of the lossy members 6-1, 6-2, 6-3, and 6-4 to the ground conductor 5 deviate to each other, even though the branch conductors 4-1 and 4-4 include the delay circuits 8-1 and 8-2, the phases of two reflection signals do not have completely inverse phases at the branch parts 3b and 3c. As a result, the two reflection signals cannot be canceled out, so that the reflection characteristics deteriorate.

Also in the second embodiment, in the case where the position of the via holes 7-1a and 7-1b in the y direction and the position of the via holes 7-2a and 7-2b in the y direction deviate to each other, the distance from the output side of the lossy member 6-1 to the ground conductor 5 and the distance from the output side of the lossy member 6-2 to the ground conductor 5 also deviate to each other.

Further, in the case where the position of the via holes 7-3a and 7-3b in the y direction and the position of the via holes 7-4a and 7-4b in the y direction deviate to each other, the distance from the output side of the lossy member 6-3 to the ground conductor 5 and the distance from the output side of the lossy member 6-4 to the ground conductor 5 also deviate to each other.

However, in the second embodiment, the branch conductor 4-1 (or 4-4) which is the first branch conductor branches into two to form a T-letter shape, and the output terminal 2b-1a (or 2b-4a), which is one of the branches, extends in the −x direction, and the output terminal 2b-1b (or 2b-4b), which is the other branch, extends in the +x direction.

Further, the branch conductor 4-2 (or 4-3) which is the second branch conductor branches into two to form a T-letter shape, and the output terminal 2b-2a (or 2b-3a), which is one of the branches, extends in the −x direction, and the output terminal 2b-2b (or 2b-3b), which is the other branch, extends in the +x direction.

Thus, even in the case where the position of the via holes 7-1a and 7-1b (or 7-4a and 7-4b) in the y direction and the position of the via holes 7-2a and 7-2b (or 7-3a and 7-3b) in the y direction deviate to each other, the influence of the deviation is reduced.

Specifically, this effect can be explained as follows.

In the following explanation, the branch conductor 4-1 and the branch conductor 4-2 are focused on; however, similar explanation can also be provided to the branch conductor 4-3 and the branch conductor 4-4.

Figure 27:
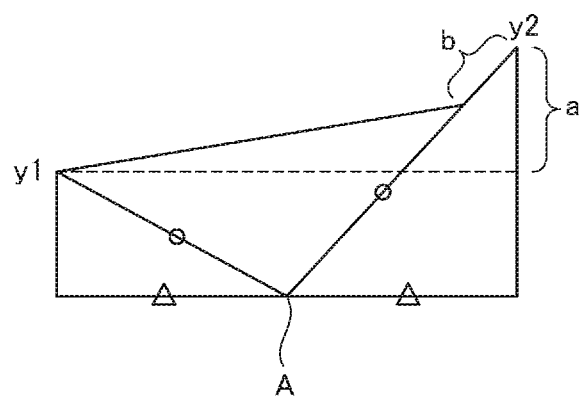
FIG. 27 is an explanatory diagram illustrating a positional deviation in the y direction of via holes.

FIG. 27 is an explanatory diagram illustrating a positional deviation in the y direction of the via holes.

In FIG. 27, y1 represents the position in the y direction of the via hole 7-1 of FIG. 1 and the position in the y direction of the via holes 7-1a and 7-1b in FIG. 6, and y2 represents the position in the y direction of the via hole 7-2 of FIG. 1 and the position in the y direction of the via holes 7-2a and 7-2b in FIG. 6, where y1<y2 holds.

The letter A indicates the position where the branch conductors 4-1 and 4-2 in FIG. 6 branch into two.

In the figure, two triangle symbols indicate that the lengths of the indicated two sides are the same, and two circle symbols indicate that the lengths of the indicated two sides are the same.

In the terminal device of FIG. 1, in the case where the position of the via hole 7-1 in the y direction is denoted as y1 and the position of the via hole 7-2 in the y direction is denoted as y2, as illustrated in FIG. 27, the difference between the distance from the output side of the lossy member 6-1 to the ground conductor 5 and the distance from the output side of the lossy member 6-2 to the ground conductor 5 is a=|y2−y1|.

In the terminal device of FIG. 6, in the case where the position of the via holes 7-1a and 7-1b in the y direction is denoted as y1 and the position of the via holes 7-2a and 7-2b in the y direction is denoted as y2, as illustrated in FIG. 27, the difference between the distance from the output side of the lossy member 6-1 to the ground conductor 5 via the via holes 7-1a and 7-1b and the distance from the output side of the lossy member 6-2 to the ground conductor 5 via the via holes 7-2a and 7-2b is b in FIG. 27.

As is apparent from FIG. 27, the difference b in the case of the second embodiment is smaller than the difference a in the case of the first embodiment, and thus the influence of the positional deviation in the y direction of the via holes is reduced.

Therefore, even in a case where the position of the via holes 7-1a and 7-1b (or 7-4a and 7-4b) in the y direction and the position of the via holes 7-2a and 7-2b (or 7-3a and 7-3b) in the y direction deviate to each other, the influence of the deviation is reduced, and thus degradation of the reflection characteristic can be suppressed more than in the first embodiment.

Third Embodiment

In the first and second embodiments, the example in which the lossy members 6-1, 6-2, 6-3, and 6-4 are disposed to cover a part of each of the branch conductors 4-1, 4-2, 4-3, and 4-4 is illustrated.

In a third embodiment, an example in which resonators are connected to parts of branch conductors 4-1, 4-2, 4-3, and 4-4 at positions where they are covered with the lossy members 6-1, 6-2, 6-3, and 6-4, respectively, will be described.

Figure 7:
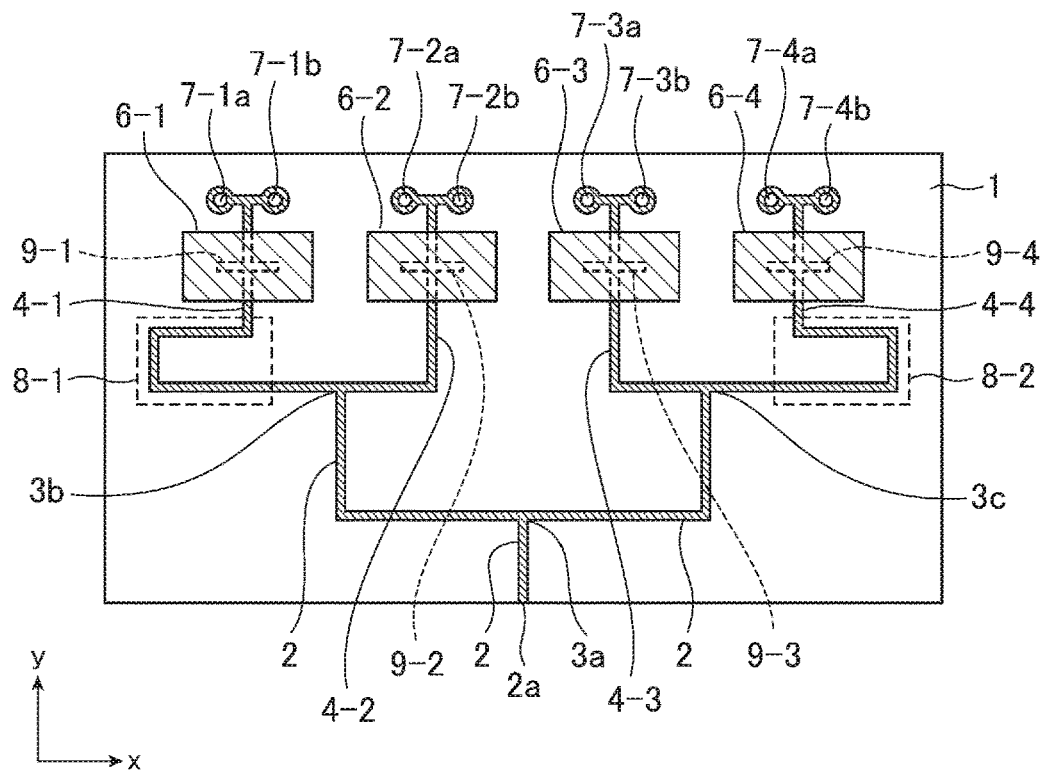
FIG. 7 is a top view illustrating a terminal device according to a third embodiment of the present invention.

FIG. 7 is a top view illustrating a terminal device according to the third embodiment of the present invention. In FIG. 7, the same symbols as those in FIG. 6 represent the same or corresponding parts and thus descriptions thereof are omitted.

A stub 9-1 branches from a branch conductor 4-1 at a part covered with a lossy member 6-1 and is a resonator which resonates with a signal propagated in the branch conductor 4-1.

A stub 9-2 branches from a branch conductor 4-2 at a part covered with a lossy member 6-2 and is a resonator which resonates with a signal propagated in the branch conductor 4-2.

A stub 9-3 branches from a branch conductor 4-3 at a part covered with a lossy member 6-3 and is a resonator which resonates with a signal propagated in the branch conductor 4-3.

A stub 9-4 branches from a branch conductor 4-4 at a part covered with a lossy member 6-4 and is a resonator which resonates with a signal propagated in the branch conductor 4-4.

FIG. 7 illustrates an example in which the stubs 9-1, 9-2, 9-3, and 9-4 are used for the terminal device of FIG. 6; however, the stubs 9-1, 9-2, 9-3, and 9-4 may be used for the terminal device of FIG. 1 or FIG. 5.

Next, the operation will be described.

Also in the third embodiment, like in the first and second embodiments, the power of signals propagated in the branch conductors 4-1, 4-2, 4-3, and 4-4 is converted into heat and lost by the lossy members 6-1, 6-2, 6-3, and 6-4, respectively.

In the third embodiment, the stubs 9-1, 9-2, 9-3, and 9-4 resonate with signals propagated in the branch conductors 4-1, 4-2, 4-3, and 4-4, and thus also in the stubs 9-1, 9-2, 9-3, and 9-4, there are parts radiating heat.

Therefore, as compared to the case where only the lossy members 6-1, 6-2, 6-3, and 6-4 are disposed, the amount of power loss of signals propagated in the branch conductors 4-1, 4-2, 4-3, and 4-4 can be increased. Therefore, reflection signals from the ground conductor 5 can be further reduced as compared with the first and second embodiments.

Note that, with adjustment of the length of lines, the stubs 9-1, 9-2, 9-3, and 9-4 can operate as matching circuits for matching input signals from an input terminal 2a with reflection signals from the ground conductor 5.

As is apparent from the above, according to the third embodiment, a resonator is connected to each of the branch conductors 4-1, 4-2, 4-3, and 4-4 at the parts covered with the lossy members 6-1, 6-2, 6-3, and 6-4, respectively, and thus deterioration of reflection characteristics accompanied by an increase of reflection signals can be further suppressed as compared with the first and second embodiments. Therefore, the available frequency band can be further broadened as compared with the first and second embodiments.

Fourth Embodiment

In the third embodiment, the example in which the stubs 9-1, 9-2, 9-3, and 9-4 are connected to the branch conductors 4-1, 4-2, 4-3, and 4-4, respectively, at parts thereof that are covered with the lossy members 6-1, 6-2, 6-3, and 6-4, respectively, is illustrated.

In this fourth embodiment, an example in which a disk-shaped conductor 9a is connected to an end portion of each of stubs 9-1, 9-2, 9-3, and 9-4 will be described.

Figure 8:
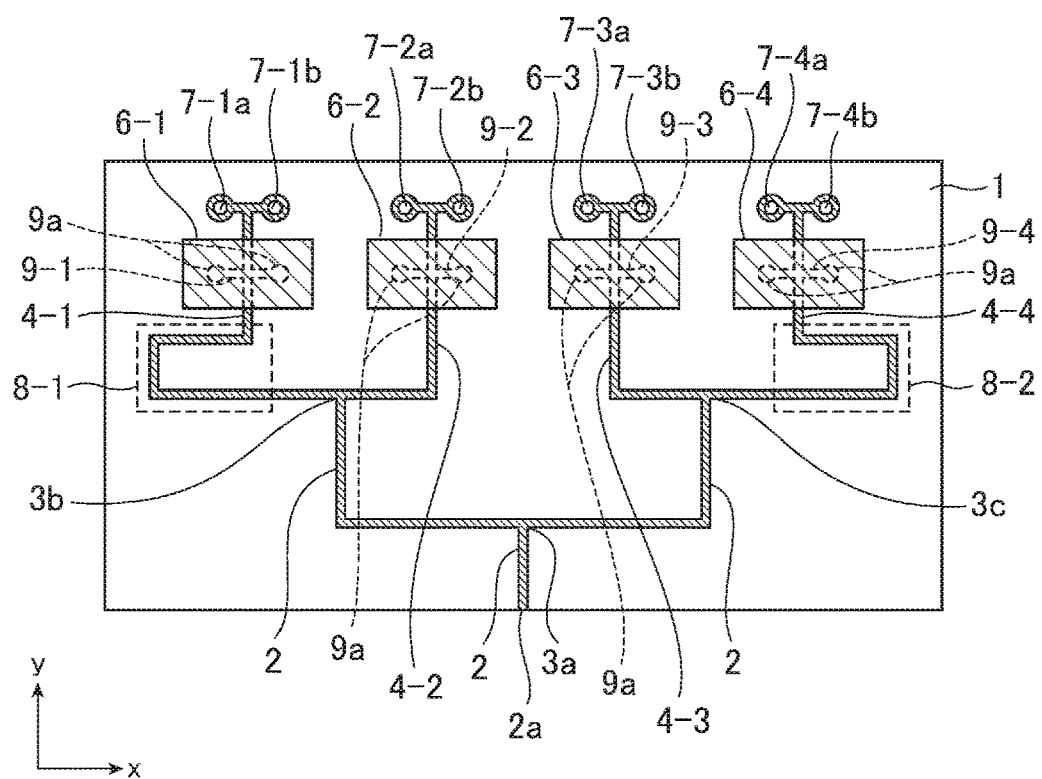
FIG. 8 is a top view illustrating a terminal device according to a fourth embodiment of the present invention.

FIG. 8 is a top view illustrating a terminal device according to the fourth embodiment of the present invention. In FIG. 8, the same symbols as those in FIG. 7 represent the same or corresponding parts and thus descriptions thereof are omitted.

A disk-shaped conductor 9a is connected to each end portion of stubs 9-1, 9-2, 9-3, and 9-4, and each of the disk-shaped conductors 9a is shaped by a curved line with no corners and has a width wider than the line widths of the stubs 9-1, 9-2, 9-3, and 9-4.

In the third embodiment, the stubs 9-1, 9-2, 9-3, and 9-4 are conductors each having linear shape, and the shapes of the stubs 9-1, 9-2, 9-3, and 9-4 are rectangular. Therefore, heat concentrates at corners of the stubs 9-1, 9-2, 9-3, and 9-4.

In the fourth embodiment, since the disk-shaped conductors 9a are connected to the end portions of the stubs 9-1, 9-2, 9-3, and 9-4, the stubs 9-1, 9-2, 9-3, and 9-4 have no corner. As a result, no position at which heat concentrates exists and heat is dispersed, and thus the power withstanding performance can be enhanced as compared with the third embodiment.

Fifth Embodiment

In the fifth embodiment, a terminal device in which a signal conductor 2 includes matching circuits 10, 11-1, and 11-2 for matching an impedance on an input side with an impedance on an output side will be described.

Figure 9:
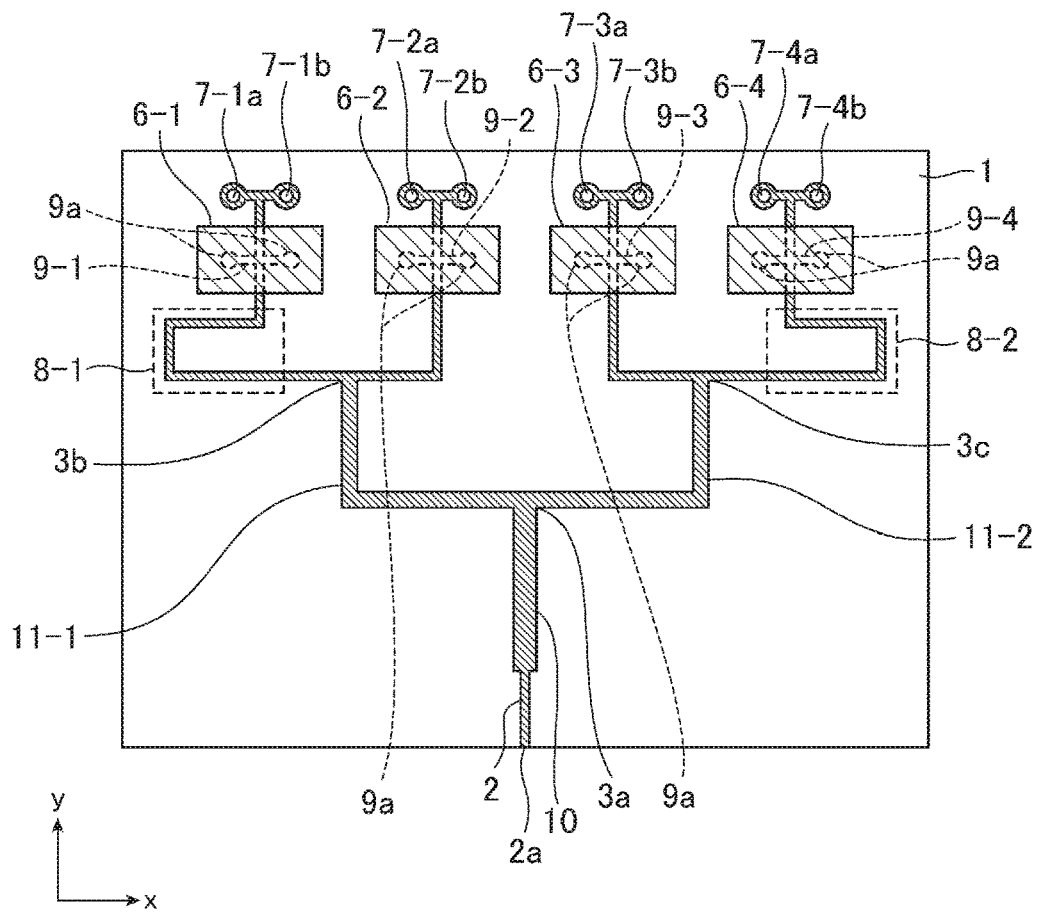
FIG. 9 is a top view illustrating a terminal device according to a fifth embodiment of the present invention.

FIG. 9 is a top view illustrating a terminal device according to the fifth embodiment of the present invention. In FIG. 9, the same symbols as those in FIG. 8 represent the same or corresponding parts and thus descriptions thereof are omitted.

A matching circuit 10 matches the impedance at an input terminal 2a of the signal conductor 2 with the impedance at a branch part 3a. Although the matching circuit 10 is a conductor for propagating a signal, the matching circuit 10 also operates as an impedance transformer since the conductor width thereof is wider than the conductor width of the signal conductor 2.

A matching circuit 11-1 has one end connected with the branch part 3a and the other end connected with a branch part 3b and matches the impedance at the branch part 3a with the impedance at the branch part 3b.

A matching circuit 11-2 has one end connected with the branch part 3a and the other end connected with a branch part 3c and matches the impedance at the branch part 3a with the impedance at the branch part 3c.

Although the matching circuits 11-1 and 11-2 is a conductor for propagating a signal, the matching circuits 11-1 and 11-2 also operate as impedance transformers since the conductor widths thereof are wider than the conductor width of the signal conductor 2.

FIG. 9 illustrates an example in which the matching circuits 10, 11-1, and 11-2 are used for the terminal device of FIG. 8; however, the matching circuits 10, 11-1, and 11-2 may be used for the terminal devices of FIG. 1 and FIGS. 5 to 7.

When the signal conductor 2 does not include the matching circuits 10, 11-1, and 11-2 as in the first to fourth embodiments, there is a possibility that impedance mismatching may occur at the branch parts 3a, 3b, and 3c, so that reflection characteristics deteriorate.

In the fifth embodiment, the matching circuit 10 matches the impedance at the input terminal 2a of the signal conductor 2 with the impedance at the branch part 3a.

Further, the matching circuit 11-1 matches the impedance at the branch part 3a with the impedance at the branch part 3b, and the matching circuit 11-2 matches the impedance at the branch part 3a with the impedance at the branch part 3c.

According to such a configuration, occurrence of impedance mismatch at the branch parts 3a, 3b, and 3c can be suppressed, and thus the available frequency band can be further broadened as compared to the first to fourth embodiments.

In the fifth embodiment, the example in which the matching circuits 10, 11-1, and 11-2 are impedance transformers is described; however, the present invention is not limited thereto. For example as illustrated in FIG. 10, the matching circuits 10, 11-1, and 11-2 may be stubs 10a, 11-1a, 11-2a, respectively.

Moreover, the impedance transformers being the matching circuits 10, 11-1, and 11-2 may further include stubs 10a, 11-1a, and 11-2a, respectively.

Figure 10:
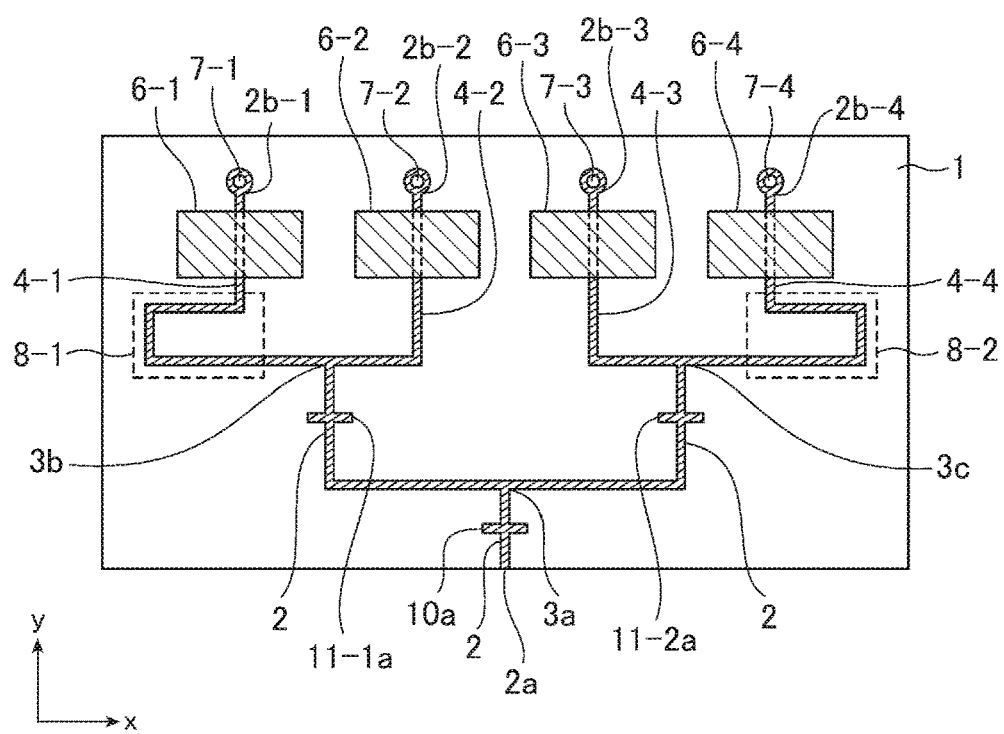
FIG. 10 is a top view illustrating another terminal device according to the fifth embodiment of the present invention.

FIG. 10 is a top view illustrating another terminal device according to the fifth embodiment of the present invention.

FIG. 10 illustrates an example in which the stubs 10a, 11-1a, and 11-2a are used for the terminal device of FIG. 1; however, the stubs 10a, 11-1a, and 11-2a may be used for the terminal devices of FIGS. 5 to 8.

Sixth Embodiment

In the above first to fifth embodiments, the examples in which the first layer of the dielectric substrate 1 is the front surface 1a of the dielectric substrate 1 and the second layer of the dielectric substrate 1 is the back surface 1b of the dielectric substrate 1 have been described.

In this sixth embodiment, an example in which a first layer of a dielectric substrate 1 is an inner layer 1c of the dielectric substrate 1 and a second layer of the dielectric substrate 1 is a front surface 1a and a back surface 1b of the dielectric substrate 1 will be explained.

Figure 11:
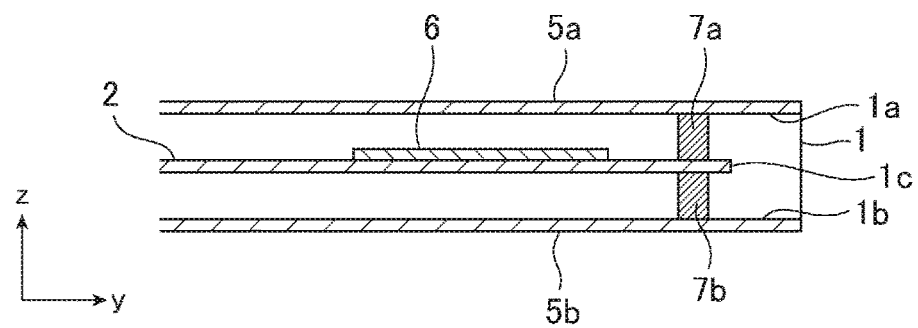
FIG. 11 is a cross-sectional view illustrating a terminal device according to a sixth embodiment of the present invention.

FIG. 11 is a cross-sectional view illustrating a terminal device according to the sixth embodiment of the present invention. In FIG. 11, the same symbols as those in FIG. 2 denote the same or corresponding parts.

A signal conductor 2 corresponds to the signal conductor 2 in the first embodiment. However, unlike the signal conductor 2 in the first embodiment, the signal conductor 2 of the sixth embodiment is disposed in an inner layer 1c of a dielectric substrate 1.

A lossy member 6 corresponds to the lossy members 6-1, 6-2, 6-3, and 6-4 in the first embodiment. However, unlike the lossy members 6-1, 6-2, 6-3, and 6-4 in the first embodiment, the lossy member 6 of the sixth embodiment is disposed in the inner layer 1c of the dielectric substrate 1.

A ground conductor 5a is arranged on the entire front surface 1a of the dielectric substrate 1.

A ground conductor 5b corresponds to the ground conductor 5 in the first embodiment and is disposed on the entire back surface 1b of the dielectric substrate 1.

Via holes 7a correspond to the via holes 7-1, 7-2, 7-3, and 7-4 in the first embodiment. However, unlike the via holes 7-1, 7-2, 7-3, and 7-4 in the first embodiment, the via holes 7a connect output terminals 2b-1, 2b-2, 2b-3, and 2b-4 of the signal conductor 2 disposed in the inner layer 1c of the dielectric substrate 1 and the ground conductor 5a.

Via holes 7b correspond to the via holes 7-1, 7-2, 7-3, and 7-4 in the first embodiment. However, unlike the via holes 7-1, 7-2, 7-3, and 7-4 in the first embodiment, the via holes 7b connect output terminals 2b-1, 2b-2, 2b-3, and 2b-4 of the signal conductor 2 disposed in the inner layer 1c of the dielectric substrate 1 and the ground conductor 5b.

The operation of the terminal device in the sixth embodiment is similar to that in each of the first to fifth embodiments.

In the sixth embodiment, not only the ground conductor 5b is arranged on the back surface 1b of the dielectric substrate 1, but also the ground conductor 5a is arranged on the front surface 1a of the dielectric substrate 1. In addition, the via holes 7a are connected to the ground conductor 5a arranged on the front surface 1a of the dielectric substrate 1, and the via holes 7b are connected to the ground conductor 5b arranged on the back surface 1b of the dielectric substrate 1.

According to such a configuration, since the total area of the ground conductor 5a and the ground conductor 5b is twice the area of the ground conductor 5 in the first to fifth embodiments, the heat radiation effect increases.

In addition, even if one of the via holes 7a and the via holes 7b is defective due to a failure at the time of manufacturing a terminal device, the terminal device can operate without a significant change in characteristics.

For example, let us assume a case where a via hole 7a connected to the ground conductor 5a arranged on the front surface 1a of the dielectric substrate 1 is defective.

In the sixth embodiment, even if such a defect occurs, the output terminals 2b-1, 2b-2, 2b-3, and 2b-4 of the signal conductor 2 are electrically connected to the ground conductor 5b through the via holes 7b connected with the ground conductor 5b arranged on the back surface 1b of the dielectric substrate 1.

Thus, even in such a case, similar characteristics to those in the case where there are no defects in the via holes 7a connected to the ground conductor 5a arranged on the front surface 1a of the dielectric substrate 1 can be achieved.

Seventh Embodiment

In the above first to fifth embodiments, the examples in which the first layer of the dielectric substrate 1 is the front surface 1a of the dielectric substrate 1 and the second layer of the dielectric substrate 1 is the back surface 1b of the dielectric substrate 1 have been described.

In this seventh embodiment, an example in which each of a first layer and a second layer of a dielectric substrate 1 is multilayered will be described.

Figure 12:
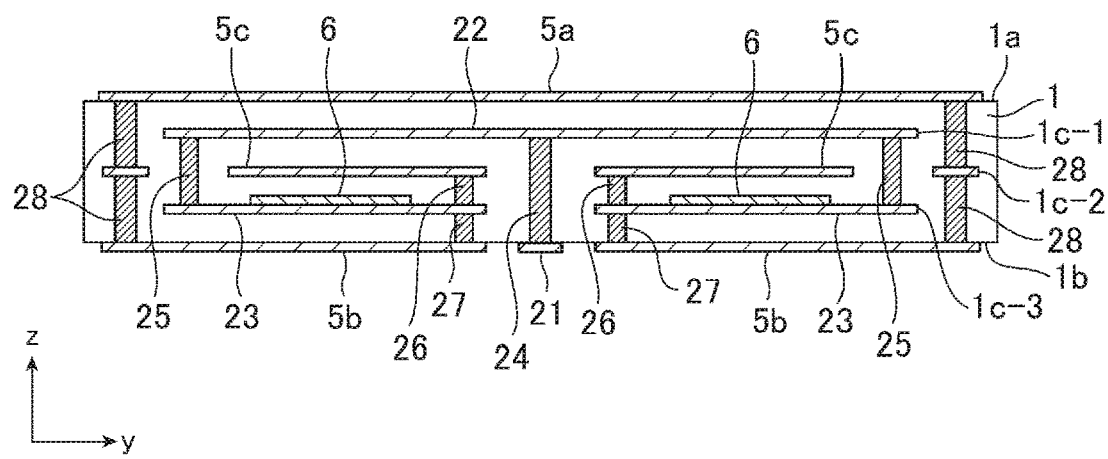
FIG. 12 is a cross-sectional view illustrating a terminal device according to a seventh embodiment of the present invention.

FIG. 12 is a cross-sectional view illustrating a terminal device according to the seventh embodiment of the present invention. In FIG. 12, the same symbols as those in FIGS. 2 and 11 denote the same or corresponding parts.

In the cross-sectional view of the terminal device illustrated in FIG. 12, a cross-sectional view when the circuit in the terminal device of FIG. 1 is used is illustrated; however, the circuit in the terminal device of any of FIGS. 5 to 9 may be used.

A front surface 1a of a dielectric substrate 1 is a second layer of the dielectric substrate 1.

A back surface 1b of the dielectric substrate 1 is the second layer of the dielectric substrate 1.

An inner layer 1c-1 of the dielectric substrate 1 is a first layer of the dielectric substrate 1.

An inner layer 1c-2 of the dielectric substrate 1 is the second layer of the dielectric substrate 1.

An inner layer 1c-3 of the dielectric substrate 1 is the first layer of the dielectric substrate 1.

A ground conductor 5c is arranged on the entire surface of the inner layer 1c-2 of the dielectric substrate 1.

An input/output terminal 21 is disposed on the back surface 1b of the dielectric substrate 1.

A distribution circuit 22 is disposed in the inner layer 1c-1 of the dielectric substrate 1 and includes a part of the signal conductor 2 in the first embodiment that is from the input terminal 2a to input sides of the lossy members 6-1, 6-2, 6-3, and 6-4.

A terminal circuit 23 is disposed in the inner layer 1c-3 of the dielectric substrate 1 and includes a part of the signal conductor 2 in the first embodiment that is from the input sides of the lossy members 6-1, 6-2, 6-3, and 6-4 to the output terminals 2b-1, 2b-2, 2b-3, and 2b-4.

A via hole 24 is a connection conductor between the back surface 1b and the inner layer 1c-1 of the dielectric substrate 1 and connects the input/output terminal 21 and the input terminal 2a of the signal conductor 2 in the distribution circuit 22.

Via holes 25 are connection conductors between the inner layer 1c-1 and the inner layer 1c-3 of the dielectric substrate 1 and connects branch conductors 4-1, 4-2, 4-3, and 4-4 in the distribution circuit 22 and the input sides of the lossy members 6-1, 6-2, 6-3, and 6-4 in the terminal circuit 23.

Via holes 26 are connection conductors between the inner layer 1c-3 and the inner layer 1c-2 of the dielectric substrate 1 and connects the output terminals 2b-1, 2b-2, 2b-3, and 2b-4 of the branch conductors 4-1, 4-2, 4-3, and 4-4 in the terminal circuit 23 and the ground conductor 5c.

Via holes 27 are connection conductors between the inner layer 1c-3 and the back surface 1b of the dielectric substrate 1 and connects the output terminals 2b-1, 2b-2, 2b-3, and 2b-4 of the branch conductors 4-1, 4-2, 4-3, and 4-4 in the terminal circuit 23 and a ground conductor 5b.

Via holes 28 are connecting conductors among the front surface 1a, the inner layer 1c-2, and the back surface 1b of the dielectric substrate 1 and connect a ground conductor 5a, the ground conductor 5b, and the ground conductor 5c.

Figure 13:
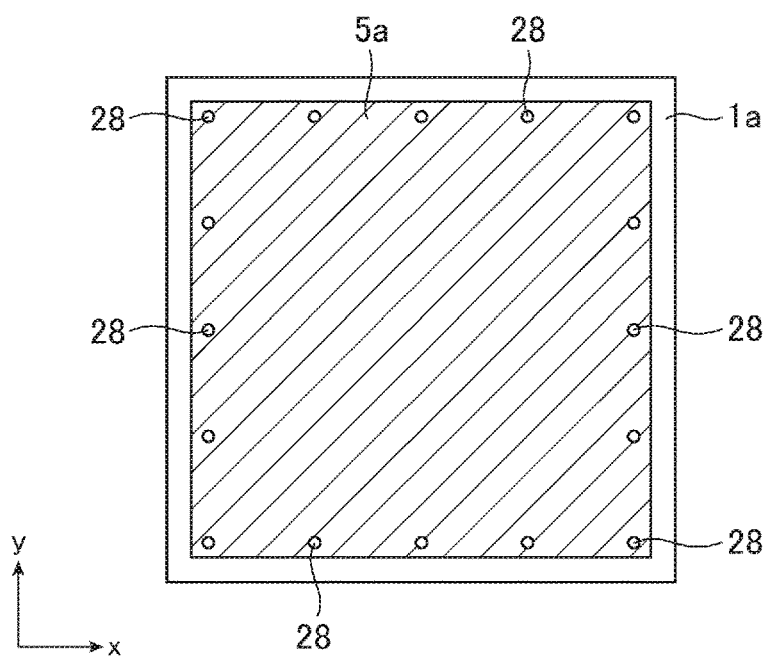
FIG. 13 is a top view of a front surface 1a of the terminal device according to the seventh embodiment of the present invention.

FIG. 13 is a top view of the front surface 1a of the terminal device according to the seventh embodiment of the present invention.

Figure 14:
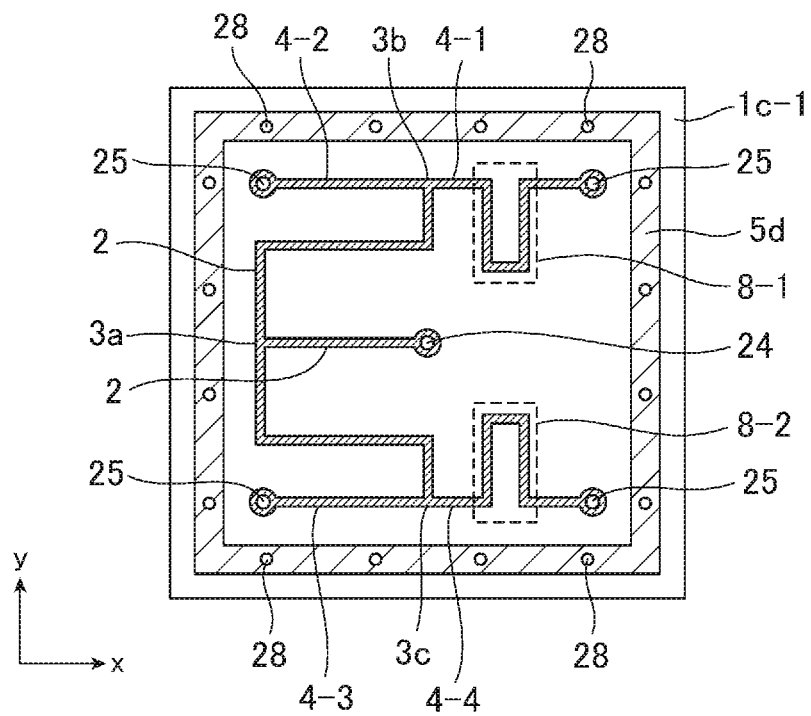
FIG. 14 is a top view of an inner layer 1c-1 of the terminal device according to the seventh embodiment of the present invention.

FIG. 14 is a top view of the inner layer 1c-1 of the terminal device according to the seventh embodiment of the present invention. In FIG. 14, reference numeral 5d denotes a ground conductor.

Figure 15:
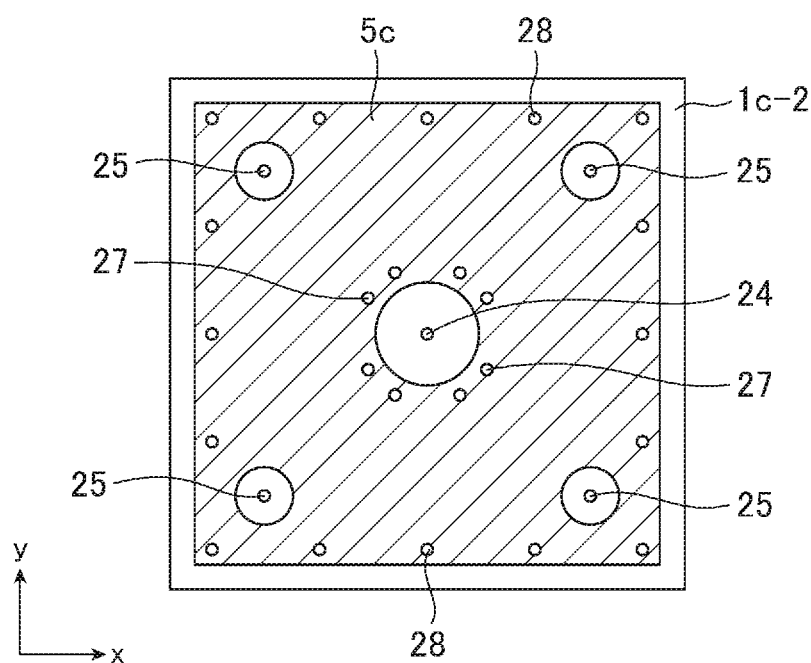
FIG. 15 is a top view of an inner layer 1c-2 of the terminal device according to the seventh embodiment of the present invention.

FIG. 15 is a top view of the inner layer 1c-2 of the terminal device according to the seventh embodiment of the present invention.

Figure 16:
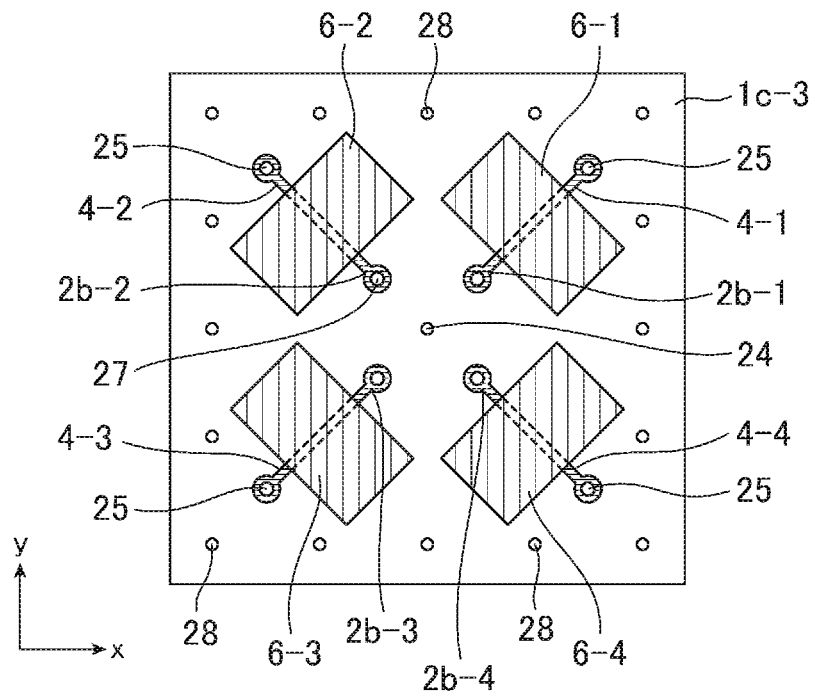
FIG. 16 is a top view of an inner layer 1c-3 of the terminal device according to the seventh embodiment of the present invention.

FIG. 16 is a top view of the inner layer 1c-3 of the terminal device according to the seventh embodiment of the present invention.

Figure 17:
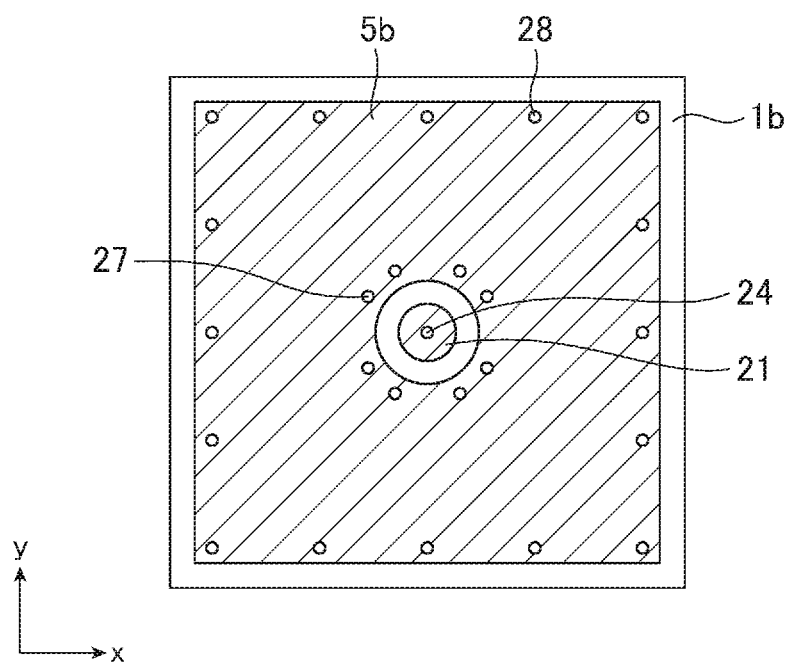
FIG. 17 is a top view of a back surface 1b of the terminal device according to the seventh embodiment of the present invention.

FIG. 17 is a top view of the back surface 1b of the terminal device according to the seventh embodiment of the present invention.

The operation of the terminal device in the seventh embodiment is similar to those in the first to fifth embodiments.

On the front surface 1a of the dielectric substrate 1, the ground conductor 5a is arranged on the entire surface as illustrated in FIG. 13, and the plurality of via holes 28 are arranged on the outer periphery region of the ground conductor 5a to surround the ground conductor 5a.

With the plurality of via holes 28 arranged at pitch less than or equal to a cutoff frequency of the available frequencies, leakage of electromagnetic waves from the circuits of the terminal device can be prevented.

In this seventh embodiment, the substrate is multilayered in order to reduce the size of the terminal device.

In order to form the terminal device to have a multilayer structure, the terminal circuit 23 is arranged in the inner layer 1c-3 illustrated in FIG. 16 which is a different layer from the inner layer 1c-1 of the dielectric substrate 1 in which the distribution circuit 22 is disposed.

In the example of FIG. 16, the via holes 26 and 27 connected to the output terminals 2b-1, 2b-2, 2b-3, and 2b-4 of the branch conductors 4-1, 4-2, 4-3, and 4-4 in the terminal circuit 23 are arranged near the center of the substrate. Further, the via hole 24 connected to the input/output terminal 21 is arranged at the center of the substrate.

Figure 18:
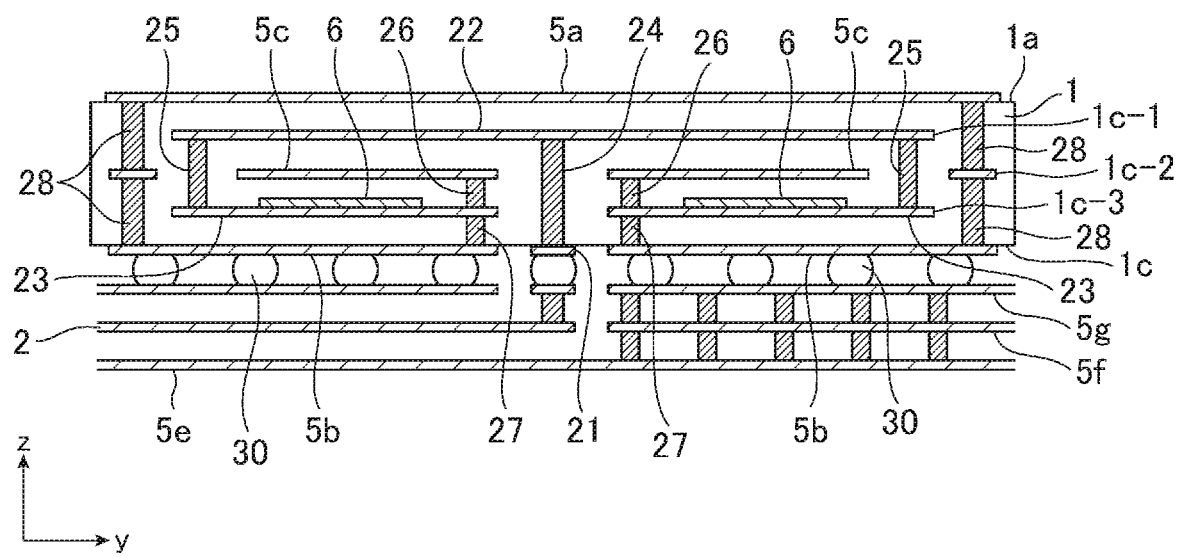
FIG. 18 is a cross-sectional view illustrating another terminal device according to the seventh embodiment of the present invention.

In this seventh embodiment, the example in which the substrate of the terminal device is multilayered is illustrated; however, by disposing solder balls 30 as illustrated in FIG. 18, it becomes possible to mount the terminal device on a surface of a substrate having a layer in which ground conductors 5e, 5f, and 5g, an integrated circuit (IC) chip, or the like is mounted, for example.

Further, in the seventh embodiment, the ground conductor 5e is disposed on the −z direction side of the signal conductor 2, and thus the signal conductor 2 in the terminal device is surrounded by the ground conductors 5a and 5e, so that the signal conductor 2 in the terminal device is electromagnetically shielded.

Eighth Embodiment

In the seventh embodiment, the example in which the substrate of the terminal device of FIG. 1 is multilayered has been described; however in this eighth embodiment, an example in which the substrate of the terminal device of FIG. 9 including the matching circuits 10, 11-1, and 11-2 is multilayered will be described.

A cross-sectional view of the terminal device in the eighth embodiment is the same as the cross-sectional view of the terminal device in FIG. 12 in the seventh embodiment.

Figure 19:
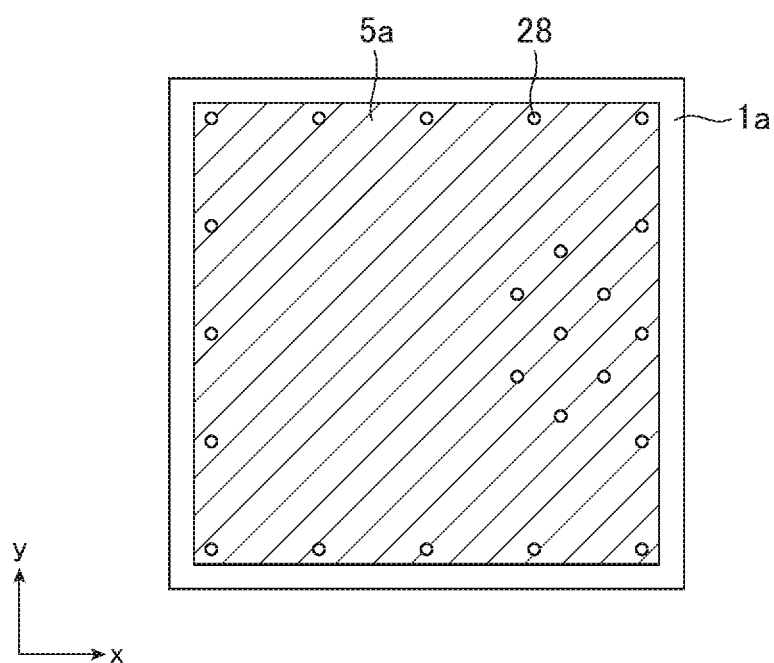
FIG. 19 is a top view of a front surface 1a of a terminal device according to an eighth embodiment of the present invention.

FIG. 19 is a top view of a front surface 1a of a terminal device according to the eighth embodiment of the present invention.

Figure 20:
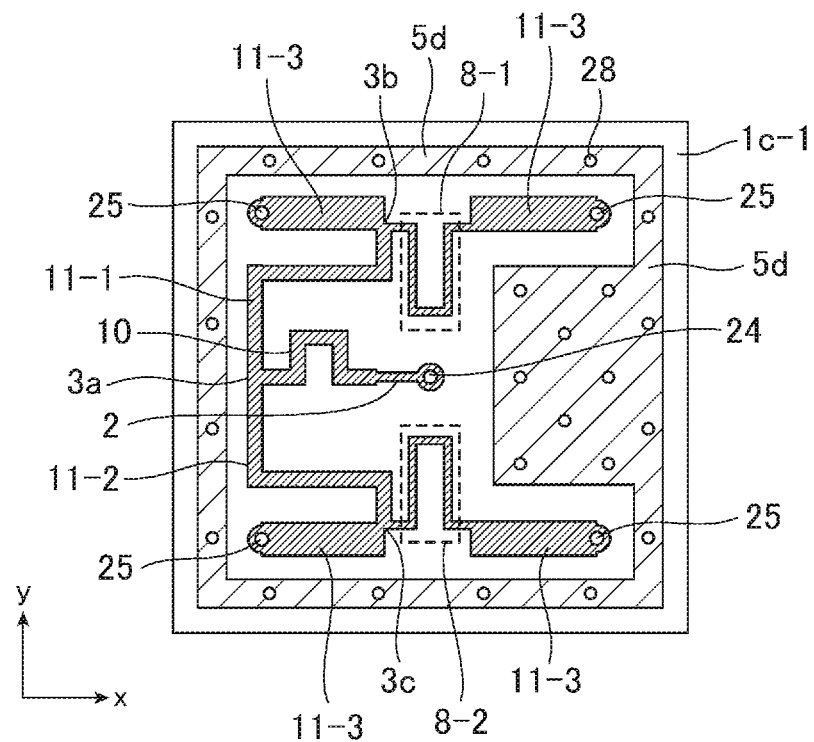
FIG. 20 is a top view of an inner layer 1c-1 of the terminal device according to the eighth embodiment of the present invention.

FIG. 20 is a top view of an inner layer 1c-1 of the terminal device according to the eighth embodiment of the present invention. In FIG. 20, reference numeral 11-3 denotes a matching circuit. In FIG. 20, an impedance transformer in which the matching circuit 11-3 has a conductor width wider than the conductor width of the signal conductor 2 is illustrated; however, the matching circuit 11-3 may be a stub.

Figure 21:
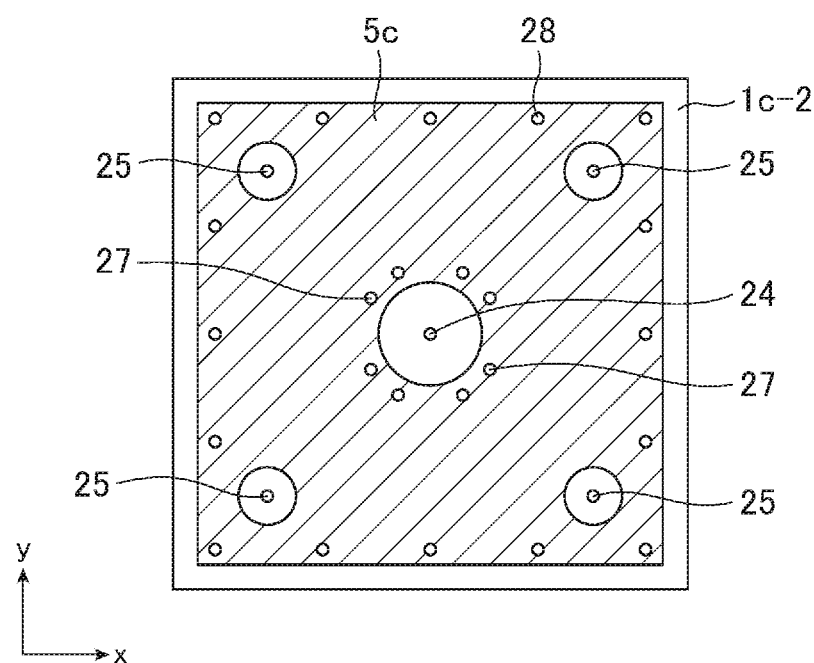
FIG. 21 is a top view of an inner layer 1c-2 of the terminal device according to the eighth embodiment of the present invention.

FIG. 21 is a top view of an inner layer 1c-2 of the terminal device according to the eighth embodiment of the present invention.

Figure 22:
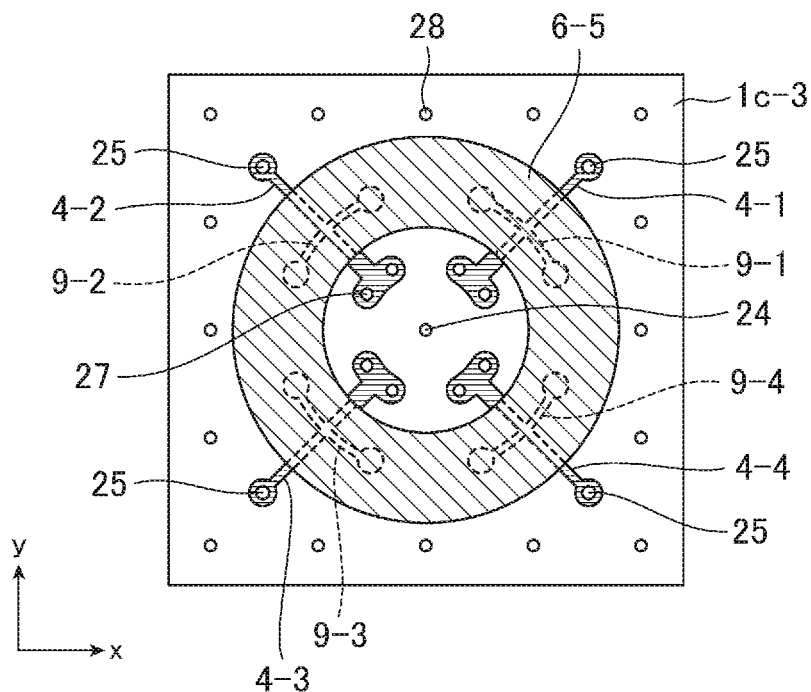
FIG. 22 is a top view of an inner layer 1c-3 of the terminal device according to the eighth embodiment of the present invention.

FIG. 22 is a top view of an inner layer 1c-3 of the terminal device according to the eighth embodiment of the present invention. In FIG. 22, a lossy member 6-5 is a ring-shaped lossy member, which is an integration of the lossy members 6-1, 6-2, 6-3, and 6-4.

Figure 23:
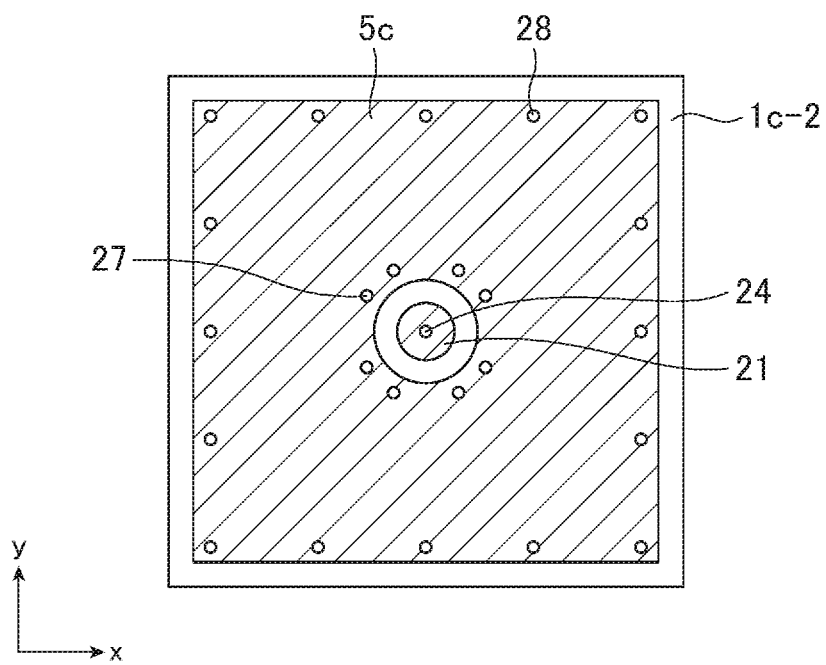
FIG. 23 is a top view of a back surface 1b of the terminal device according to the eighth embodiment of the present invention.

FIG. 23 is a top view of a back surface 1b of the terminal device according to the eighth embodiment of the present invention.

The operation of the terminal device in the eighth embodiment is similar to that in the fifth embodiment.

Therefore, in the eighth embodiment, similar effects as those of the fifth embodiment can be obtained.

Further, in the eighth embodiment, even in the case where the terminating device includes the matching circuits 10,

17

11-1, 11-2, and 11-3, since the substrate is multilayered like in the seventh embodiment, the terminal device can be downsized.

Ninth Embodiment

In the seventh and eighth embodiments, the example in which the distribution circuit 22 is disposed in the inner layer 1c-1 of the dielectric substrate 1 and the terminal circuit 23 is disposed in the inner layer 1c-3 of the dielectric substrate 1 has been described.

In the ninth embodiment, the arrangement of the distribution circuit 22 and the terminal circuit 23 can be reversed upside down with a distribution circuit 22 arranged in the inner layer 1c-3 of a dielectric substrate 1 and a terminal circuit 23 arranged in an inner layer 1c-1 of the dielectric substrate 1.

Figure 24:
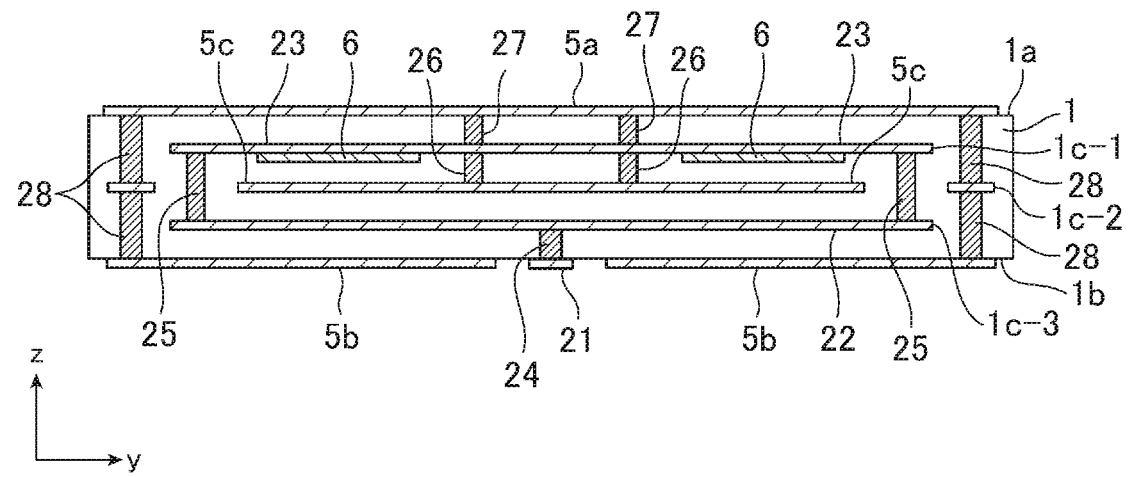
FIG. 24 is a cross-sectional view illustrating a terminal device according to a ninth embodiment of the present invention.

FIG. 24 is a cross-sectional view illustrating a terminal device according to the ninth embodiment of the present invention.

The operation of the terminal device in the ninth embodiment is similar to that in each of the seventh and eighth embodiments.

Therefore, in the ninth embodiment, similar effects as those of the seventh and eighth embodiments can be obtained.

Figure 25:
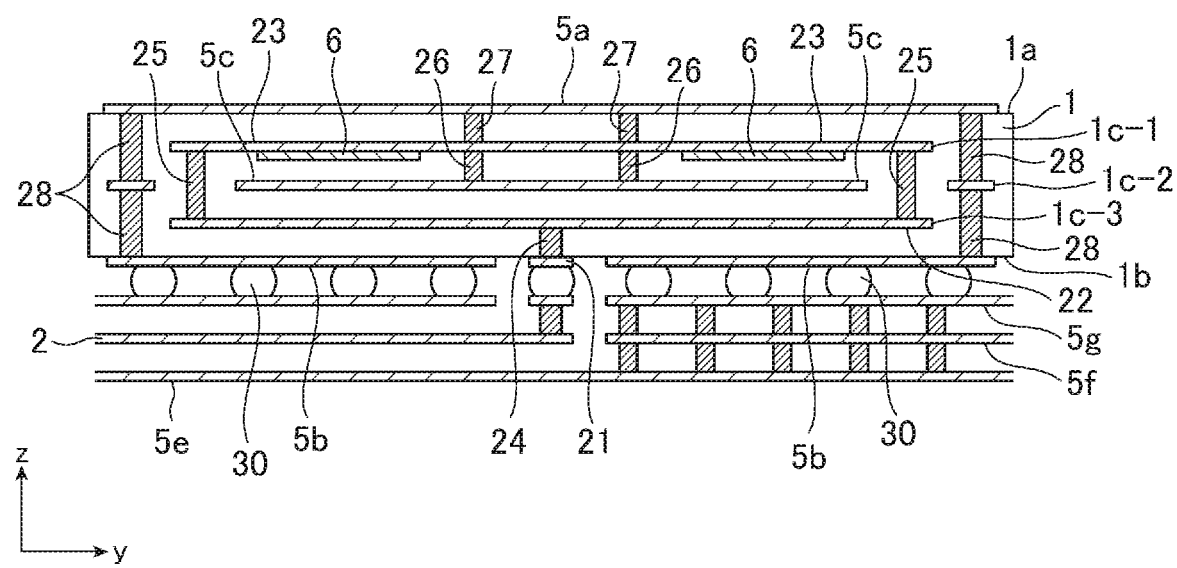
FIG. 25 is a cross-sectional view illustrating another terminal device according to the ninth embodiment of the present invention.

Also in this ninth embodiment, by disposing solder balls 30 on a back surface 1b of the dielectric substrate 1 as illustrated in FIG. 25, it becomes possible to mount the terminal device on a surface of a substrate having a layer in which ground conductors 5e, 5f, and 5g, an IC chip, or the like is mounted, for example.

FIG. 25 is a cross-sectional view illustrating another terminal device according to the ninth embodiment of the present invention.

Figure 26:
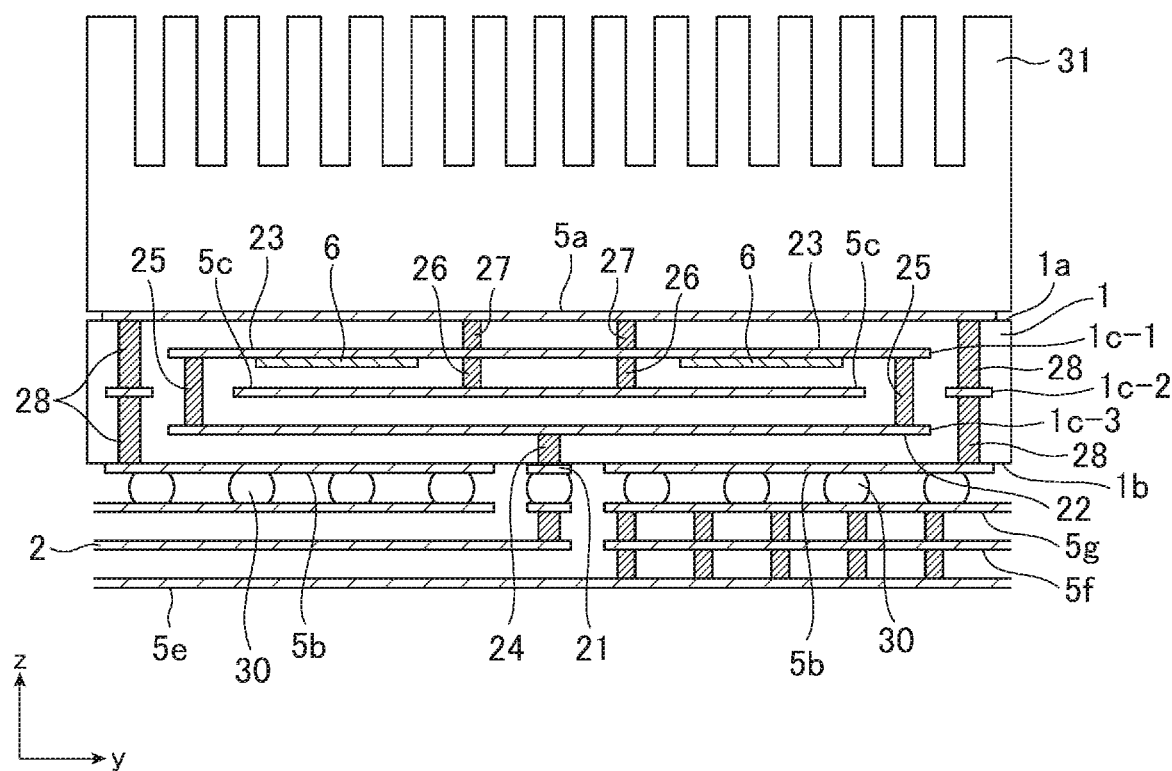
FIG. 26 is a cross-sectional view illustrating still another terminal device according to the ninth embodiment of the present invention.

Further, in this ninth embodiment, as illustrated in FIG. 26, a heat radiating fins 31 may be attached to the front surface 1a of the dielectric substrate 1.

FIG. 26 is a cross-sectional view illustrating still another terminal device according to the ninth embodiment of the present invention.

By attaching the heat radiating fins 31 on the front surface 1a of the dielectric substrate 1, heat can be radiated from the front surface 1a of the dielectric substrate 1.

Note that, within the scope of the present invention, the present invention may include a flexible combination of the respective embodiments, a modification of any component of the respective embodiments, or an omission of any component in the respective embodiments.

INDUSTRIAL APPLICABILITY

The present invention is suitable for a terminal device for suppressing unnecessary reflection of a signal.

REFERENCE SIGNS LIST

1: Dielectric substrate, 1a, 1c: Front surface of dielectric substrate 1 (first layer, second layer), 1b: Back surface of dielectric substrate 1 (second layer), 1c-1: Inner layer of dielectric substrate 1 (first layer), 1c-2: Inner layer of dielectric substrate 1 (second layer), 1c-3: Inner layer of dielectric substrate 1 (first layer), 2: Signal conductor, 2a: Input terminal, 2b-1, 2b-1a, 2b-1b, 2b-4, 2b-4a, 2b-4b: Output terminal (first output terminal), 2b-2, 2b-2a, 2b-2b, 2b-3, 2b-3a, 2b-3b: Output terminal (second output terminal), 3a, 3b, 3c: Branch part (branching point), 4-1, 4-4: Branch conductor (first branch conductor), 4-2, 4-3: Branch conductor (second branch conductor), 4-5, 4-6, 4-7, 4-8: Branch conductor, 5, 5a, 5b, 5c, 5d, 5e, 5f, 5g: Ground conductor, 6, 6-1, 6-2, 6-3, 6-4, 6-5, 6-6: Lossy member, 7-1, 7-1a, 7-1b, 7-2, 7-2a, 7-2b, 7-3, 7-3a, 7-3b, 7-4, 7-4a, 7-4b, 7a, 7b: Via hole (connecting member), 8-1, 8-2, 8-3: Delay circuit, 9-1, 9-2, 9-3, 9-4: Stub (resonator), 9a: Disk-shaped conductor, 10, 11-1, 11-2: Matching circuit, 10a, 11-1a, 11-2a: Stub, 21: Input/output terminal, 22: Distribution circuit, 23: Terminal circuit, 24, 25, 26, 27, 28: Via hole, 30: Solder ball, 31: Heat radiating fin.

The invention claimed is:

1. A terminal device comprising:
a dielectric substrate formed of a dielectric;
a signal conductor disposed in a first layer of the dielectric substrate, the signal conductor having a branching point at which the signal conductor branches into two, the branching point being between an input terminal and at least one first output terminal, the branching point also being between the input terminal and at least one second output terminal;
a ground conductor disposed in a second layer of the dielectric substrate opposing the first layer of the dielectric substrate;
lossy members disposed to overlap with: a part of a first branch conductor extending from the branching point of the signal conductor to the at least one first output terminal; and a part of a second branch conductor extending from the branching point of the signal conductor to the at least one second output terminal, in a thickness direction of the dielectric substrate, the lossy members causing a loss of power of signals flowing in the first branch conductor and the second branch conductor; and
connecting members connecting each of the at least one first output terminal and the at least one second output terminal and the ground conductor, the connecting members each formed as a via hole connecting the first layer and the second layer of the dielectric substrate,
wherein the first branch conductor includes a delay circuit having an electrical length longer than an electrical length of the second branch conductor by 90 degrees, and the ground conductor is disposed on an entire surface of the second layer of the dielectric substrate.

2. The terminal device according to claim 1, wherein the first layer of the dielectric substrate is a front surface of the dielectric substrate, and the second layer of the dielectric substrate is a back surface of the dielectric substrate.

3. The terminal device according to claim 1,
wherein the at least one first output terminal comprises two branched first output terminals,
the first branch conductor branches into two to form the two branched first output terminals of the first branch conductor,
a first direction oriented from the branching point of the first branch conductor toward one of the branched first output terminals and a second direction oriented from the branching point of the first branch conductor toward the other of the branched first output terminals are orthogonal to a direction oriented from an input side part of the branching point toward the branching point, and the first direction and the second direction are opposite to each other,
the at least one second output terminal comprises two branched second output terminals, the second branch conductor branches into two to form the two branched second output terminals of the second branch conductor, and a third direction oriented from the branching point of the second branch conductor toward one of the branched second output terminals and a fourth direction oriented from the branching point of the second branch conductor toward the other of the branched second output terminals are orthogonal to a direction oriented from an input side part of the branching point toward the branching point, and the third direction and the fourth direction are opposite to each other.

4. The terminal device according to claim 1, further comprising resonators connected with the first branch conductor and the second branch conductor at parts where the lossy members are overlapped with the first branch conductor and the second branch conductor, respectively.

5. The terminal device according to claim 4, wherein the resonators are stubs branching from each of the first branch conductor and the second branch conductor.

6. The terminal device according to claim 5, wherein each of end portions of the stubs has a shape formed by a curved line with no corners and has a width wider than line widths of the stubs.

7. The terminal device according to claim 1, wherein the signal conductor includes a matching circuit matching an impedance on an input side and an impedance on an output side.

8. The terminal device according to claim 7, wherein the matching circuit is an impedance transformer or a stub.

9. The terminal device according to claim 1, wherein the first layer of the dielectric substrate is an inner layer of the dielectric substrate, and the second layer of the dielectric substrate includes a front surface and a back surface of the dielectric substrate.

10. The terminal device according to claim 1, wherein each of the first layer and the second layer of the dielectric substrate is multilayered, a part of the signal conductor where the lossy members are overlapped and a part of the signal conductor where the lossy members are not overlapped are arranged in different layers in the first layer, and the ground conductor is arranged in a plurality of layers in the second layer.

* * * * *